US010580725B2

(12) United States Patent
Huang et al.

(10) Patent No.: US 10,580,725 B2
(45) Date of Patent: Mar. 3, 2020

(54) ARTICLES HAVING VIAS WITH GEOMETRY ATTRIBUTES AND METHODS FOR FABRICATING THE SAME

(71) Applicant: Corning Incorporated, Corning, NY (US)

(72) Inventors: Tian Huang, Painted Post, NY (US); Yuhui Jin, Painted Post, NY (US); Matthew Evan Wilhelm, New Haven, CT (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 15/977,195

(22) Filed: May 11, 2018

(65) Prior Publication Data
US 2018/0342450 A1 Nov. 29, 2018

Related U.S. Application Data

(60) Provisional application No. 62/510,869, filed on May 25, 2017.

(51) Int. Cl.
*H01L 23/498* (2006.01)
*H01L 23/15* (2006.01)
(Continued)

(52) U.S. Cl.
CPC ...... *H01L 23/49827* (2013.01); *H01L 21/486* (2013.01); *H01L 21/4864* (2013.01);
(Continued)

(58) Field of Classification Search
CPC ............. H01L 23/49827; H01L 21/486; H01L 23/49838; H01L 23/15; H01L 24/16; H01L 21/4864; H01L 2224/16235
See application file for complete search history.

(56) References Cited

U.S. PATENT DOCUMENTS

| 108,387 A | 9/1878 | Geoege |
| 237,571 A | 8/1881 | Messier |

(Continued)

FOREIGN PATENT DOCUMENTS

| CN | 100494879 C | 6/2009 |
| CN | 104897062 A | 9/2015 |

(Continued)

OTHER PUBLICATIONS

Kiyama et al; "Examination of Etching Agent and Etching Mechanism on Femtosecond Laser Microfabrication of Channels Inside Vitreous Silica Substrates"; J. Phys. Chem. C, 2009, 113, pp. 11560-11566.

(Continued)

*Primary Examiner* — Anthony Ho
(74) *Attorney, Agent, or Firm* — Amy T. Lang; John P. McGroarty

(57) ABSTRACT

Articles and semiconductor packages that incorporate glass-based substrates are disclosed, as well as methods of forming thereof. An article includes a glass-based substrate comprising first and second major surfaces spaced a distance from and parallel to each other, and a tapered via extending through the substrate. The tapered via includes a cross section that is symmetrical about a plane that is between and equidistant to the first and second major surfaces of the glass-based substrate and an interior wall with a first tapered region and a second tapered region positioned between the first major surface and the plane. The respective slopes of the first and second tapered regions are constant and the slope of the first tapered region is not equal to the slope of the second tapered region.

20 Claims, 19 Drawing Sheets

(51) Int. Cl.
    *H01L 21/48*     (2006.01)
    *H01L 23/00*     (2006.01)

(52) U.S. Cl.
    CPC ........ *H01L 23/15* (2013.01); *H01L 23/49838* (2013.01); *H01L 24/16* (2013.01); *H01L 2224/16235* (2013.01)

(56) References Cited

U.S. PATENT DOCUMENTS

| | | |
|---|---|---|
| 3,798,013 A | 3/1974 | Hasegawa et al. |
| 4,395,271 A | 7/1983 | Beall et al. |
| 5,745,236 A | 4/1998 | Haga |
| 5,746,884 A | 5/1998 | Gutpa |
| 5,909,284 A | 6/1999 | Nakamura |
| 5,933,230 A | 8/1999 | Imaino et al. |
| 6,072,624 A | 6/2000 | Dixon et al. |
| 6,234,755 B1 | 5/2001 | Bunker et al. |
| 6,344,242 B1 | 2/2002 | Stolk et al. |
| 6,906,795 B2 | 6/2005 | Goto et al. |
| 7,019,257 B2 | 3/2006 | Stevens |
| 7,043,072 B2 | 5/2006 | Goto et al. |
| 7,211,899 B2 | 5/2007 | Taniguchi et al. |
| 7,407,889 B2 | 8/2008 | Tsunetomo et al. |
| 7,528,967 B2 | 5/2009 | Okawauchi et al. |
| 7,626,665 B2 | 12/2009 | Koike |
| 7,683,370 B2 | 3/2010 | Kugimiya et al. |
| 7,749,809 B2 | 7/2010 | How et al. |
| 7,994,503 B2 | 8/2011 | Hino et al. |
| 8,119,462 B2 | 2/2012 | Takasawa et al. |
| 8,163,649 B2 | 4/2012 | Koike et al. |
| 8,338,957 B2 | 12/2012 | Nilsson |
| 8,384,083 B2 | 2/2013 | Mori et al. |
| 8,411,459 B2 | 4/2013 | Yu et al. |
| 8,482,189 B2 | 7/2013 | Goto et al. |
| 8,531,679 B2 | 9/2013 | Scheiner |
| 8,535,997 B2 | 9/2013 | Kawakami et al. |
| 8,643,129 B2 | 2/2014 | Laming et al. |
| 8,699,037 B2 | 4/2014 | Cox |
| 8,742,588 B2 | 6/2014 | Nilsson et al. |
| 8,871,641 B2 | 10/2014 | Nilsson |
| 8,873,067 B2 | 10/2014 | Lee et al. |
| 9,024,443 B2 | 5/2015 | Inaba et al. |
| 9,093,381 B2 | 7/2015 | Barriere et al. |
| 9,140,539 B2 | 9/2015 | Scheiner |
| 9,232,652 B2 | 1/2016 | Fushie et al. |
| 9,278,886 B2 | 3/2016 | Boek et al. |
| 9,296,646 B2 | 3/2016 | Burket et al. |
| 9,305,470 B2 | 4/2016 | Miki et al. |
| 9,346,706 B2 | 5/2016 | Bazemore et al. |
| 9,377,583 B2 | 6/2016 | Giaretta et al. |
| 9,517,963 B2 | 12/2016 | Marjanovic et al. |
| 9,676,046 B2 | 6/2017 | Hamada et al. |
| 9,745,220 B2 | 8/2017 | Burket et al. |
| 9,760,986 B2 | 9/2017 | Ramamurthy et al. |
| 9,850,160 B2 | 12/2017 | Marjanovic et al. |
| 10,144,093 B2 | 12/2018 | Marjanovic et al. |
| 10,203,476 B2 | 2/2019 | Cui |
| 2002/0051563 A1 | 5/2002 | Goto et al. |
| 2002/0180015 A1 | 12/2002 | Yamaguchi et al. |
| 2003/0206651 A1 | 11/2003 | Goto et al. |
| 2004/0058476 A1 | 3/2004 | Enquist et al. |
| 2004/0094524 A1 | 5/2004 | Stevens |
| 2004/0256619 A1 | 12/2004 | Nomura et al. |
| 2005/0029238 A1 | 2/2005 | Chen |
| 2005/0033184 A1 | 2/2005 | Christoph |
| 2005/0079650 A1 | 4/2005 | Mancini et al. |
| 2005/0266320 A1 | 12/2005 | Amemiya |
| 2006/0012766 A1 | 1/2006 | Klosner et al. |
| 2006/0192978 A1 | 8/2006 | Bertran et al. |
| 2009/0029189 A1 | 1/2009 | Moriwaki et al. |
| 2009/0032510 A1 | 2/2009 | Ando et al. |
| 2010/0133697 A1 | 6/2010 | Nilsson |
| 2010/0284027 A1 | 11/2010 | Scheiner |
| 2011/0032467 A1 | 2/2011 | Koike |
| 2011/0132883 A1 | 6/2011 | Sheng et al. |
| 2011/0308942 A1 | 12/2011 | Liu et al. |
| 2012/0048604 A1 | 3/2012 | Cornejo et al. |
| 2012/0092681 A1 | 4/2012 | Cox |
| 2012/0125892 A1 | 5/2012 | Shimoi et al. |
| 2012/0125893 A1 | 5/2012 | Shimoi et al. |
| 2012/0168412 A1 | 7/2012 | Hooper |
| 2012/0235969 A1 | 9/2012 | Burns et al. |
| 2012/0241919 A1 | 9/2012 | Mitani |
| 2012/0276743 A1 | 11/2012 | Won et al. |
| 2013/0050226 A1 | 2/2013 | Shenoy et al. |
| 2013/0089701 A1 | 4/2013 | Hooper et al. |
| 2013/0105213 A1 | 5/2013 | Hu et al. |
| 2013/0163801 A1 | 6/2013 | Ha et al. |
| 2013/0205835 A1 | 8/2013 | Giaretta et al. |
| 2013/0224492 A1 | 8/2013 | Bookbinder et al. |
| 2013/0228918 A1 | 9/2013 | Chen et al. |
| 2013/0330515 A1 | 12/2013 | Oh et al. |
| 2013/0337599 A1 | 12/2013 | Yun |
| 2014/0147623 A1 | 5/2014 | Shorey et al. |
| 2014/0147624 A1 | 5/2014 | Streltsov et al. |
| 2014/0154439 A1 | 6/2014 | Demartino et al. |
| 2014/0166199 A1 | 6/2014 | Bellman et al. |
| 2014/0170378 A1 | 6/2014 | Bellman et al. |
| 2014/0199519 A1 | 7/2014 | Schillinger et al. |
| 2014/0254004 A1 | 9/2014 | Wooder et al. |
| 2014/0300728 A1 | 10/2014 | Drescher et al. |
| 2014/0376006 A1 | 12/2014 | Scheiner |
| 2015/0036065 A1 | 2/2015 | Yousefpor et al. |
| 2015/0060402 A1 | 3/2015 | Burkett et al. |
| 2015/0102498 A1 | 4/2015 | Enicks et al. |
| 2015/0166393 A1 | 6/2015 | Marjanovic et al. |
| 2015/0166395 A1 | 6/2015 | Marjanovic et al. |
| 2015/0166396 A1 | 6/2015 | Marjanovic et al. |
| 2015/0274583 A1 | 10/2015 | An et al. |
| 2015/0306847 A1 | 10/2015 | Bellman et al. |
| 2015/0329415 A1 | 11/2015 | Bellman et al. |
| 2016/0026842 A1 | 1/2016 | Withers et al. |
| 2016/0107925 A1 | 4/2016 | Burket et al. |
| 2016/0166395 A9 | 6/2016 | Weiman |
| 2016/0199944 A1 | 7/2016 | Hosseini |
| 2016/0201474 A1 | 7/2016 | Slavens et al. |
| 2016/0204126 A1 | 7/2016 | Amano |
| 2016/0208387 A1 | 7/2016 | Liu et al. |
| 2016/0219704 A1 | 7/2016 | Vandemeer et al. |
| 2016/0237571 A1 | 8/2016 | Liu et al. |
| 2016/0282584 A1 | 9/2016 | Cui |
| 2016/0305764 A1 | 10/2016 | Cui et al. |
| 2016/0312365 A1 | 10/2016 | Cordonier et al. |
| 2016/0327744 A1 | 11/2016 | Giaretta et al. |
| 2016/0334203 A1 | 11/2016 | Cui et al. |
| 2016/0351410 A1 | 12/2016 | Fu et al. |
| 2016/0368100 A1 | 12/2016 | Marjanovic et al. |
| 2017/0008122 A1 | 1/2017 | Wieland et al. |
| 2017/0036419 A1 | 2/2017 | Adib et al. |
| 2017/0160077 A1 | 6/2017 | Featherstone et al. |
| 2017/0228884 A1 | 8/2017 | Yoshida |
| 2017/0252859 A1 | 9/2017 | Kumkar et al. |
| 2017/0276951 A1 | 9/2017 | Kumkar et al. |
| 2017/0363417 A1 | 12/2017 | Cui et al. |
| 2018/0057390 A1 | 3/2018 | Hackert et al. |
| 2018/0062342 A1 | 3/2018 | Comstock, II et al. |
| 2018/0068868 A1 | 3/2018 | Jaramillo et al. |
| 2018/0093914 A1 | 4/2018 | Akarapu et al. |
| 2018/0215647 A1 | 8/2018 | Ortner et al. |

FOREIGN PATENT DOCUMENTS

| | | |
|---|---|---|
| EP | 247993 A1 | 12/1987 |
| EP | 280918 A2 | 9/1988 |
| EP | 3166372 A1 | 5/2017 |
| JP | 2003148931 A | 5/2003 |
| JP | 2004363212 A | 12/2004 |
| JP | 2005257339 A | 9/2005 |
| JP | 2008288577 A | 11/2008 |
| JP | 2010074017 A | 4/2010 |
| JP | 2011178642 A | 9/2011 |
| JP | 2013220958 A | 10/2013 |
| JP | 2015146410 A | 8/2015 |
| WO | 03021004 A1 | 3/2003 |

(56) References Cited

FOREIGN PATENT DOCUMENTS

| WO | 2008110061 | A1 | 9/2008 |
|---|---|---|---|
| WO | 2015113023 | A1 | 7/2015 |
| WO | 2015157202 | A1 | 10/2015 |
| WO | 2016010954 | A2 | 1/2016 |
| WO | 2016089844 | A1 | 6/2016 |
| WO | 2016118683 | A1 | 7/2016 |
| WO | 2016176171 | A1 | 11/2016 |
| WO | 2017038075 | A1 | 3/2017 |
| WO | 2017062798 | A1 | 4/2017 |
| WO | 2018162385 | A1 | 9/2018 |

OTHER PUBLICATIONS

Ogutu et al; "Superconformal Filling of High Aspect Ratio Through Glass Vias (TGV) for Interposer Applications Using TNBT and NTBC Additives"; Journal of the Electrochemical Society, 162 (9), D457-D464 (2015).

Topper et al; "3-D Thin Film Interposer Based on TGV (Through Glass Vias): An Alternative to Si-Interposer"; IEEE, Electronic Components and Technology Conference; 2010; pp. 66-73.

International Search Report and Written Opinion PCT/US2018/033809 dated Nov. 30, 2018, 13 Pgs.

Benjamin et al; "The Adhesion of Evaporated Metal Films on Glass" ; Proc. Roy. Soc. A., vol. 261, (1962); pp. 516-531.

Borghi et al; "M2 Factor of Bessel-Gauss Beams" ; Optics Letters; vol. 22, No. 5; (1997) pp. 262-264.

Chen et al. "Development of an AOI system for chips with a hole on backside based on a frame imager". Proc. of SPIE vol. 9903, 2016. 6 pgs.

Iijima et al; "Resistivity Reduction by External Oxidation of Cu—Mn Alloy Films for Semiconductor Interconnect Application" ; Journal of Vacuum Science & Technology B: Microelectronics and Nanometer Structures Processing, Measurement, and Phenomena, 27, 1963-1968 (2009).

Intergrace, "Borosilicate glass: technical glass by Pulles & Hanique: Duan & Pyrex," Pulles & Hanique B.V., 2 pgs. Published Mar. 15, 2012, retrieved from: https://web.archive.org/web/20120315092729/http://www.pulleshanique.com/02_borosilicate-glass.htm.

Koike et al; "P-33: Cu—Mn Electrodes for a-Si TFT and Its Electrical Characteristics" ; SID Symposium Digest of Technical Papers, 41:1, 1343-1346 (2010).

Koike et al; "Self-Forming Diffusion Barrier Layer in Cu—Mn Alloy Metallization" ; Appl. Phys. Lett. 87, 041911-1 - 041911-3 (2005).

Microchemicals, "Silicon Wafers, Quartz Wafers, Glass Wafers," Product Specifications: Brochure. 2014, 28 pgs.

Yun et al; "P-23:The Contact Properties and TFT Structures of A-IGZO TFTS Combined With Cu—Mn Alloy Electrodes"; SID Symposium Digest of Technical Papers 42:1, 1177-1180.

Shorey et al; "Progress and Application of Through Glass via (TGV) Technology" ; 2016 Pan Pacific Microelectronis Symposium, SMTA, Jan. 25, 2016; pp. 1-6.

Shorey; "Leveraging Glass for Advanced Packaging and IoT" ; Apr. 21, 2016, Retrieved Form the Internet: URL:http://www.corning.com/media/worldwide/cdt/documents/iMAPs%20-%20Corning%20Overview%20-%204-21-16%20FINALpptx.pdf.

Siegman; "New Development in Laser Resonators" ; SPIE, vol. 1227, Optical Resonators (1990) pp. 2-14.

Thiele; "Relation Between Catalytic Activity and Size of Particle" ; Industrial and Engineering Chemistry, vol. 31, No. 7; (1939) pp. 916-920.

U.S. Appl. No. 62/846,059; Cai et al. "Silicate Glass Compositions Useful for the Efficient Production of Through Glass Vias" , Filed May 10, 2019, 43 pgs.

U.S. Appl. No. 62/846,102; Guo et al. "High Silicate Glass Articles Possessing Through Glass Vias and Methods of Making and Using Thereof" , Filed May 10, 2019, 36 pgs.

Wakayama et al. "Small size probe for inner profile measurement of pipes using optical fiber ring beam device" Proc. of SPIE vol. 8563, 2012. 7 pgs.

Wu et al, "A Study on Annealing Mechanisms With Different Manganese Contents in CuMn Alloy"; Journal of Alloys and Compounds, vol. 542, 2012, pp. 118-123.

Zavyalov, "3D Hole Inspection Using Lens with High Field Curvature" Measurement Science Review, V. 15, No. 1, 2015. pp. 52-57.

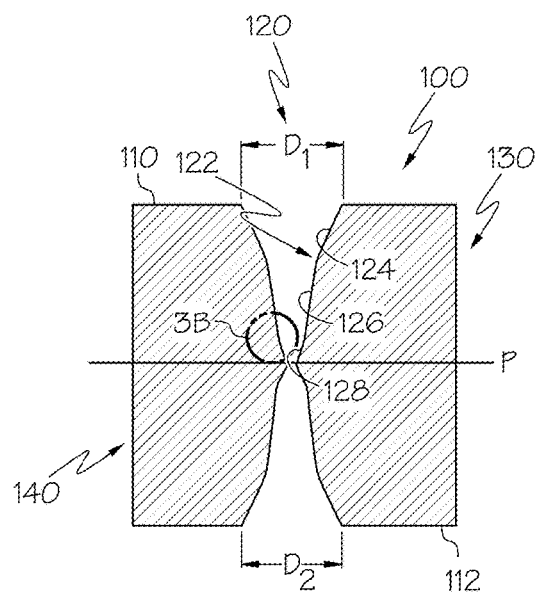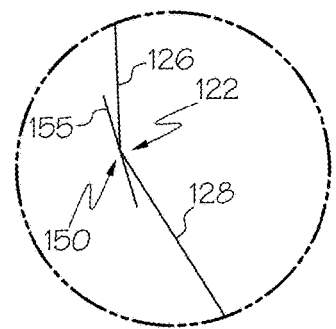
FIG. 3A
FIG. 3B
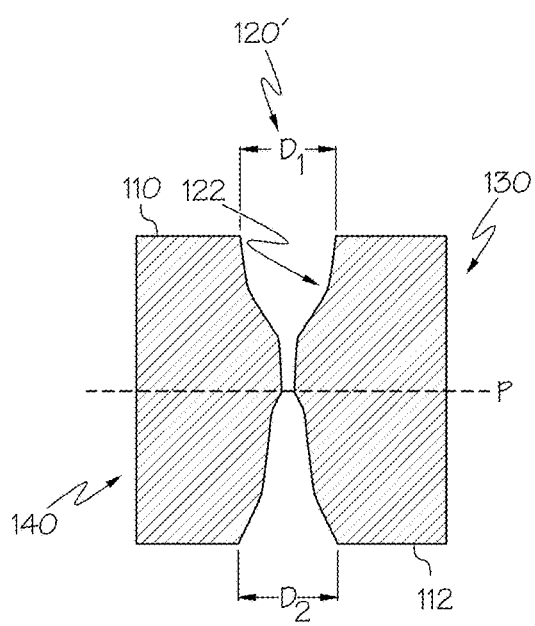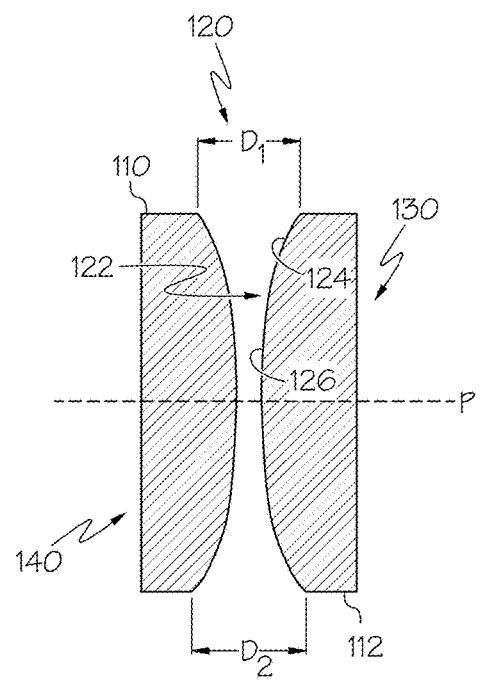
FIG. 3C
FIG. 3D

ARTICLES HAVING VIAS WITH GEOMETRY ATTRIBUTES AND METHODS FOR FABRICATING THE SAME

This application claims the benefit of priority under 35 U.S.C. § 119 of U.S. Provisional Application Ser. No. 62/510,869 filed on May 25, 2017 the content of which is relied upon and incorporated herein by reference in its entirety.

BACKGROUND

Field

The present disclosure generally relates to articles having vias etched therein. In particular, the present disclosure is directed to articles having vias with a particular geometry, as well as to laser and etching processes for fabricating such articles.

Technical Background

Substrates, such as silicon, have been used as an interposer disposed between electrical components (e.g., printed circuit boards, integrated circuits, and the like). Metalized through-substrate vias provide a path through the interposer for electrical signals to pass between opposite sides of the interposer. Glass is a substrate material that is highly advantageous for electrical signal transmission, as it has dimensional stability, a tunable coefficient of thermal expansion ("CTE"), very good low electrical loss at high frequencies electrical performance, high thermal stability, and an ability to be formed at thickness and at large panel sizes. However, through-glass via ("TGV") formation and metallization present challenges in development of the glass interposer markets.

Via geometry attributes play a role in the ability for vias within a glass-based substrate to be properly metalized. For example, during a sputter metallization process, the angle of the taper of a side wall of a via may increase the field of view of the via sidewall relative to the sputtered material, which, in turn, prevents the encapsulation of air bubbles against the glass surface and toward the centerline of the via. These air bubbles create processing issues during high temperature redistribution layer ("RDL") operations and may decrease the reliability of the substrate.

Accordingly, a need exists for substrates having particular via geometries, as well as methods of forming the same.

SUMMARY

According to one embodiment, an article includes a glass-based substrate having a first major surface, a second major surface spaced a distance from the first major surface, and a tapered through via extending through the substrate from the first major surface towards the second major surface. The tapered through via includes a cross section that is symmetrical about a plane that is between and equidistant to the first major surface and the second major surface of the glass-based substrate, and an interior wall having a first tapered region and a second tapered region positioned between the first major surface and the plane. A slope of the first tapered region is constant and a slope of the second tapered region is constant. The slope of the first tapered region is not equal to the slope of the second tapered region.

In another embodiment, an article includes a glass-based substrate having a first major surface, a second major surface spaced a distance from the first major surface, and a tapered via extending through the substrate from the first major surface towards the second major surface. The tapered via includes a cross section that is asymmetrical about a plane that is between and equidistant to the first major surface and the second major surface of the glass-based substrate, and an interior wall having a first tapered region and a second tapered region positioned between the first major surface and the plane. A slope of the first tapered region is constant and a slope of the second tapered region is constant. The slope of the first tapered region is not equal to the slope of the second tapered region.

In another embodiment, a semiconductor package includes a glass-based substrate having a first major surface, a second major surface spaced a distance from the first major surface, and a tapered via extending through the substrate from the first major surface towards the second major surface. The tapered through via includes a cross section that is symmetrical about a plane that is between and equidistant to the first major surface and the second major surface of the glass-based substrate, and an interior wall having a first tapered region and a second tapered region positioned between the first major surface and the plane. A slope of the first tapered region is constant and a slope of the second tapered region is constant. The slope of the first tapered region is not equal to the slope of the second tapered region. The semiconductor package further includes an electrically conductive material disposed within the tapered via and a semiconductor device electrically coupled to the electrically conductive material disposed within the tapered via.

In another embodiment, a semiconductor package includes a glass-based substrate having a first major surface, a second major surface spaced a distance from the first major surface, and a tapered via extending through the substrate from the first major surface towards the second major surface. The tapered via includes a cross section that is asymmetrical about a plane that is between and equidistant to the first major surface and the second major surface of the glass-based substrate, and an interior wall having a first tapered region and a second tapered region positioned between the first major surface and the plane. A slope of the first tapered region is constant and a slope of the second tapered region is constant. The slope of the first tapered region is not equal to the slope of the second tapered region. The semiconductor package further includes an electrically conductive material disposed within the tapered via and a semiconductor device electrically coupled to the electrically conductive material disposed within the tapered via.

In another embodiment, a method of forming a glass-based substrate having at least one via includes etching s glass-based article having at least one damage track with a first etchant at a first etch rate and etching the glass-based article with a second etchant at a second etch rate to form the glass-based substrate having the at least one via. The second etchant bath comprises a concentration of etchant that is different from a concentration of etchant in the first etchant bath. The at least one via includes a first tapered region having a first constant slope and a second tapered region having a second constant slope, the first constant slope and the second constant slope are unequal.

In another embodiment, a method of forming a glass-based substrate having at least one through via includes etching a glass-based article in an etchant and modulating at least one of a temperature, a concentration, and a degree of agitation of the etchant to form the glass-based substrate having the at least one through via such that the at least one through via has a continuously varying sidewall taper and a symmetric profile about a center of the glass-based substrate In another embodiment, a method of forming a glass-based substrate having at least one blind via includes etching a glass-based article in an etchant bath, and modulating at least one of a temperature, a concentration, and a degree of agitation of the etchant bath to form the glass-based substrate having the at least one blind via such that the at least one blind via includes a continuously varying sidewall taper.

Additional features and advantages of the methods for forming glass-based structures, such as interposers and interposer assemblies, will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

The embodiments set forth in the drawings are illustrative and exemplary in nature and are not intended to limit the subject matter defined by the claims. The following detailed description of the illustrative embodiments can be understood when read in conjunction with the following drawings, where like structure is indicated with like reference numerals and in which:

FIG. 3A schematically depicts a cross-sectional side view of an illustrative via geometry according to one or more embodiments shown and described herein;

FIG. 3B schematically depicts a detailed view of a change in slope between two tapered regions of an interior wall of the via of FIG. 3A according to one or more embodiments shown and described herein;

FIG. 3C schematically depicts a cross-sectional side view of another illustrative via geometry according to one or more embodiments shown and described herein;

FIG. 3D schematically depicts a cross-sectional side view of yet another via geometry according to one or more embodiments shown and described herein;

DETAILED DESCRIPTION

Referring generally to the figures, embodiments of the present disclosure are generally related to articles having vias (e.g., holes) and surface attributes which allow for successful downstream processing including, but not limited to, via metallization and application of redistribution layers (RDL). The article may be for use in semiconductor devices, radio-frequency (RF) devices (e.g., antennae, switches, and the like), interposer devices, microelectronic devices, optoelectronic devices, microelectronic mechanical system (MEMS) devices and other applications where vias may be leveraged.

More particularly, embodiments described herein are directed to glass-based articles having vias formed by a laser damage and etch process that include a particular interior wall geometry, such as an interior wall having a plurality of regions that each have a distinctive slope. Ultimately, the vias may be coated or filled with an electrically conductive material. Vias having particular interior wall geometries may increase the reliability of downstream processes, such as metallization processes. For example, the particular geometries of the interior walls may prevent the encapsulation of air bubbles against the surface of the side wall during the metallization process.

Embodiments of the present disclosure are further directed to laser forming and etching processes that result in glass-based articles having vias with the desired geometry. Articles, such as glass articles, having the desired via geometry described herein may be implemented as an interposer in a semiconductor device, such as an RF antenna, for example.

Various embodiments of articles, semiconductor packages, and methods of forming a via in a substrate are described in detail below.

The term "interposer" generally refers to any structure that extends or completes an electrical connection through the structure, for example but not limited to, between two or more electronic devices disposed on opposite surfaces of the interposer. The two or more electronic devices may be co-located in a single structure or may be located adjacent to one another in different structures such that the interposer functions as a portion of an interconnect nodule or the like. As such, the interposer may contain one or more active areas in which through-glass-vias and other interconnect conductors (such as, for example, power, ground, and signal conductors) are present and formed. The interposer may also include one or more active areas in which blind vias are present and formed. When the interposer is formed with other components, such as dies, underfill materials, encapsulants, and/or the like, the interposer may be referred to as an interposer assembly. Also, the term "interposer" may further include a plurality of interposers, such as an array of interposers or the like.

Figure 1:
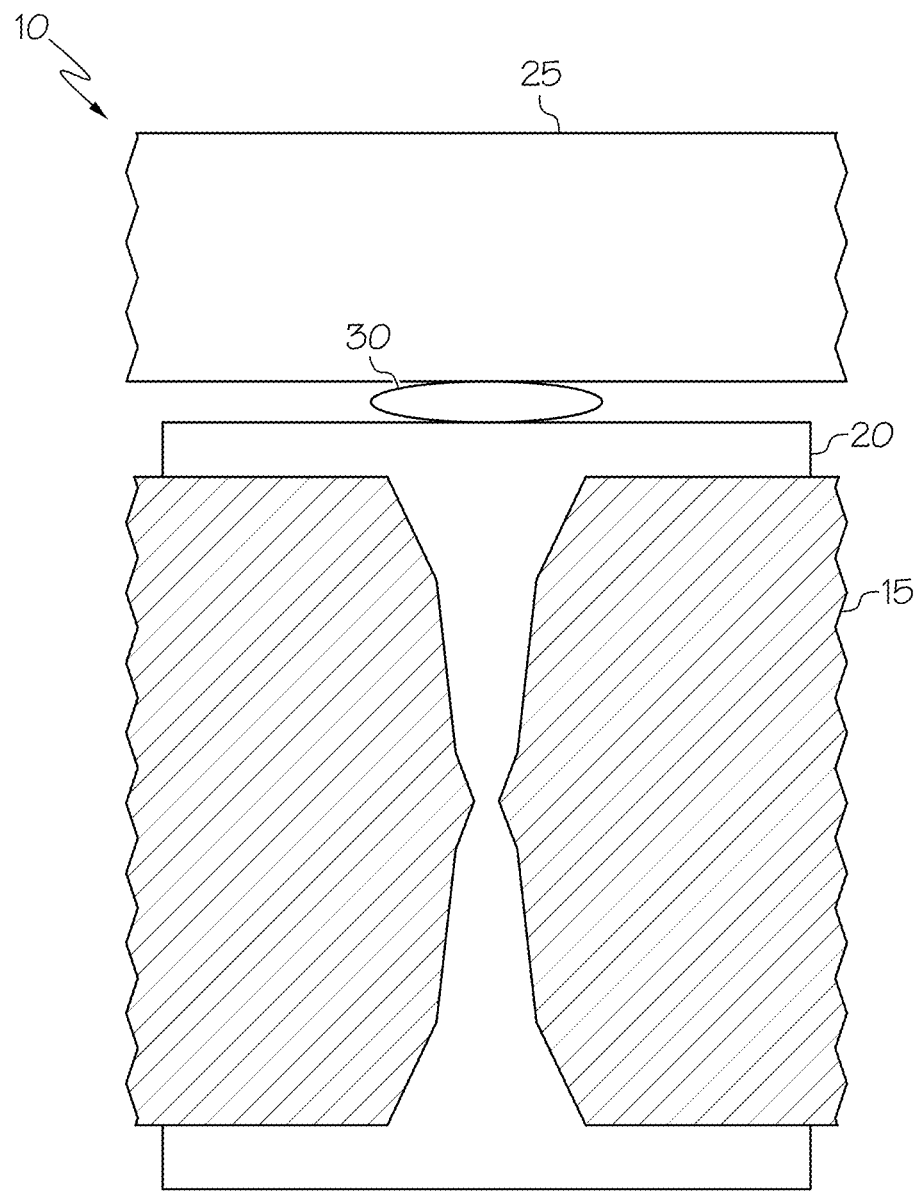
FIG. 1 schematically depicts an illustrative semiconductor assembly including a glass interposer according to one or more embodiments shown and described herein.

FIG. 1 depicts an illustrative example of a semiconductor package, generally designated 10, that includes an article 15, a conductive material 20, and a semiconductor device 25. The various components of the semiconductor package 10 may be arranged such that the conductive material 20 is disposed on at least a portion of the article 15, such as, for example, disposed within the via of the substrate of the article 15, as described in greater detail herein. The semiconductor device 25 may be coupled such that the semiconductor device 25 is in electrical contact with the conductive material 20. In some embodiments, the semiconductor device 25 may directly contact the conductive material 20. In other embodiments, the semiconductor device 25 may indirectly contact the conductive material 20, such as via bumps 30 and/or the like.

Figure 2A:
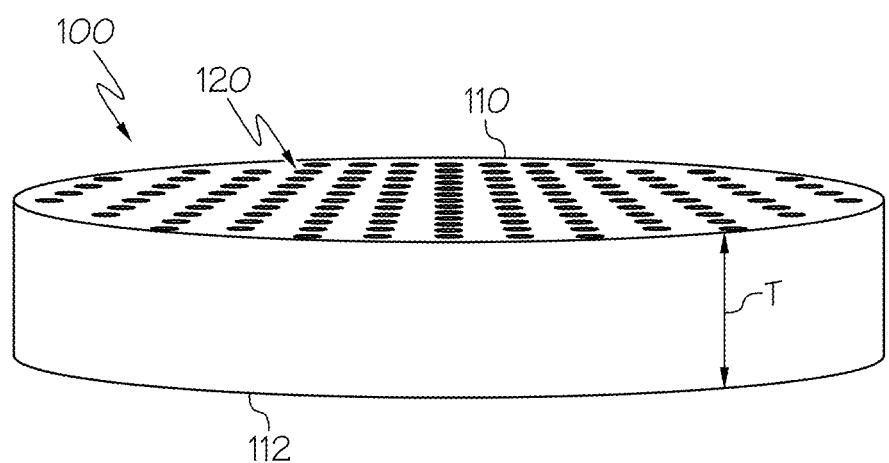
FIG. 2A schematically depicts an illustrative article configured as a wafer having vias therein according to one or more embodiments shown and described herein.
Figure 2B:
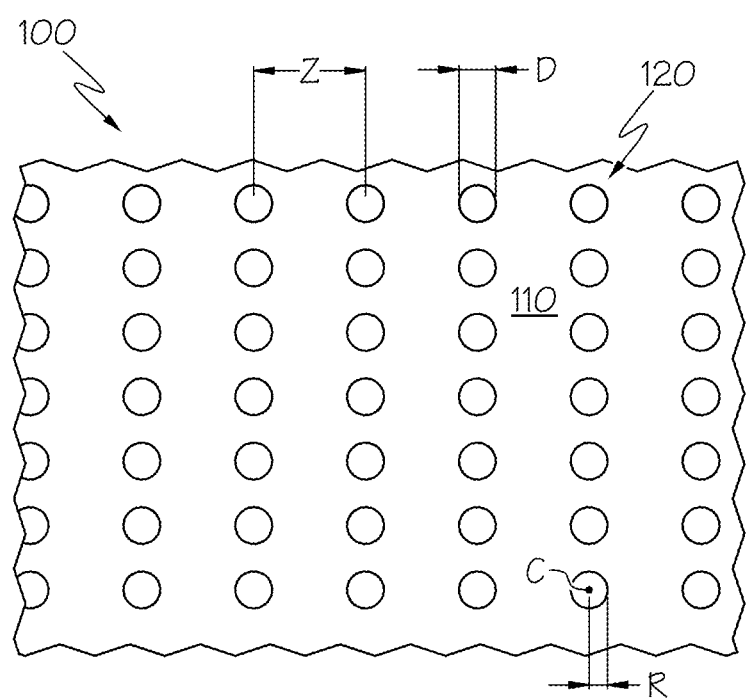
FIG. 2B schematically depicts a top view of a portion of an illustrative wafer having vias therein according to one or more embodiments shown and described herein.

FIG. 2A schematically illustrates a perspective view of an exemplary substrate 100 having a plurality of vias 120 disposed therein. FIG. 2B schematically depicts a top-down view of the example article depicted in FIG. 2A. Although FIGS. 2A and 2B depict the substrate 100 configured as a wafer, it should be understood that the article may take on any shape, such as, without limitation, a panel. The substrate 100 may be generally planar and may have a first major surface 110 and a second major surface 112 positioned opposite to and planar with the first major surface 110.

The articles described herein are fabricated from a light-transmissive material capable of allowing radiation having a wavelength within the visible spectrum to pass therethrough. For example, the substrate 100 may transmit at least about 70%, at least about 75%, at least about 80%, at least about 85%, or at least about 90% of at least one wavelength in a range from about 390 nm to about 700 nm. The substrate 100 may be a glass-based substrate. Glass-based substrate materials are materials partly or wholly made of glass, and include but are not limited to, glass (including fused silica), and glass-ceramics. In some embodiments, the substrate 100 can be glass and the glass can include fused silica, alkali containing glass, or alkali-free glass (for example an alkali-free alkaline aluminoborosilicate glass). In some embodiments, the substrate 100 may be a laminate of glass layers, glass-ceramic layers, or a combination of glass and glass-ceramic layers. In some embodiments, the substrate 100 is formed from a glass or glass-ceramic which may be chemically strengthened, such as by ion exchange processing (e.g., "chemically strengthened glass" or "chemically strengthened glass-ceramic"). For example, the substrate 100 may be formed from soda-lime glass batch compositions, alkali aluminosilicate glass batch compositions, or other glass batch compositions which may be strengthened by ion exchange after formation. In one particular example, the substrate 100 may be formed from Gorilla® Glass produced by Corning Incorporated.

In some embodiments, the substrate 100 may have a low coefficient of thermal expansion (e.g., less than or equal to about 4 ppm/° C.) and in other embodiments, the substrate 100 may have a high coefficient of thermal expansion (e.g., greater than about 4 ppm/° C.).

As noted hereinabove, the substrate 100 may be implemented as an interposer in an electronic device to pass electrical signals through substrate 100, for example, but not limited to, between one or more electronic components coupled to a first major surface 110 and one or more electronic components coupled to a second major surface 112 of the substrate 100. The vias 120 of the substrate 100 are filled with an electrically conductive material to provide electrically conductive vias through which electrical signals may pass. The vias 120 may be through-glass-vias or blind vias, for example. As used herein, a through-glass-via extends through a thickness T of the substrate 100 from the first major surface 110 to the second major surface 112. As used herein, a blind via extends only partially through the thickness T of the substrate 100 from one of the first major surface 110 or the second major surface 112 but not all the way to the other of the first major surface 110 or the second major surface 112. Other features may be formed within the first major surface 110 or the second major surface 112 of the substrate 100, such as, without limitation, channels that may be metalized to provide one or more patterns of electrical traces. Other features may also be provided.

The substrate 100 has any size and/or shape, which may, for example, depend on the end application. As an example and not a limitation, the thickness T of the substrate 100 may be within a range of about 25 microns to about 3,000 microns, including about 25 microns, about 50 microns, about 75 microns, about 100 microns, about 200 microns, about 300 microns, about 400 microns, about 500 microns, about 600 microns, about 700 microns, about 800 microns, about 900 microns, about 1,000 microns, about 2,000 microns, about 3,000 microns, or any value or range between any two of these values (including endpoints).

The vias 120 of the substrate 100 may have an opening diameter D, for example, of about 10 microns to about 250 microns, including about 15 microns or less, about 20 microns or less, about 25 microns or less, about 30 microns or less, 35 microns or less, about 40 microns or less, about 50 microns or less, about 60 microns or less, about 70 microns or less, about 80 microns or less, about 90 microns or less, about 100 microns or less, about 110 microns or less, about 120 microns or less, about 130 microns or less, about 140 microns or less, about 150 microns or less, about 160 microns or less, about 170 microns or less, about 180 microns or less, about 190 microns or less, about 200 microns or less, about 210 microns or less, about 220 microns or less, about 230 microns or less, about 240 microns or less, about 250 microns or less, or any value or range between any two of these values (including endpoints). As used herein, the opening diameter D refers to a diameter of the opening of the via 120 at the first major surface 110 or at the second major surface 112 of the substrate 100. The opening of the via 120 is generally at a location that marks a transition between the substantially horizontal major surface 110, 112 and a sloped surface of a wall of the via 120. The opening diameter D of the vias 120 may be determined by finding a diameter of a least-squares best fit circle to the edges of the entrance to the vias 120 as imaged by an optical microscope.

Similarly, the vias 120 of the substrate 100 may have an opening radius R of about 5 microns to about 150 microns. As used herein, the opening radius R refers to the radius from a center point C of the opening of the via 120 at the first major surface 110 or at the second major surface 112 of the substrate 100.

A pitch Z of the vias 120, which is the center-to-center spacing between adjacent vias 120, may be any dimension according to the desired application, such as, without limitation, about 10 microns to about 2,000 microns, including about 10 microns, about 50 microns, about 100 microns, about 250 microns, about 1,000 microns, about 2,000 microns, or any value or range between any two of these values (including endpoints). In some embodiments, the pitch Z may vary between vias 120 on the same substrate 100 (i.e., the pitch Z between a first via and a second via may be different from a pitch Z between the first via and a third via). In some embodiments, the pitch Z may be a range, such as about 10 microns to about 100 microns, about 25 microns to about 500 microns, about 10 microns to about 1,000 microns, or about 250 microns to about 2,000 microns.

As defined herein, the average thickness T of the substrate 100 is determined by calculating the average of three thickness measurements taken outside of any depressed region on the first major surface 110 or the second major surface 112 due to the formation of the vias 120. As defined herein, the thickness measurements are taken by an interferometer. As described in more detail below, the laser damage and etch process may create depressed regions surrounding the holes formed within the substrate 100. Thus, the average thickness T is determined by measuring the thickness of the substrate 100 at three locations outside of the depressed region. As used herein, the phrase "outside of the depressed region" means that the measurement is taken at a distance in a range from about 500 microns and about 2,000 microns from the nearest via 120. Further, to obtain an accurate representation of the average thickness of the article, the measurement points should be at least about 100 microns away from one another. In other words, no measurement point should be within 100 microns of another measurement point.

As noted hereinabove, the vias 120 (and other features in some embodiments) may be filled with an electrically conductive material using any known technique including, but not limited to, sputtering, electroless and/or electrolytic plating, chemical vapor deposition, and/or the like. The electrically conductive material may be, for example, copper, silver, aluminum, titanium, gold, platinum, nickel, tungsten, magnesium, or any other suitable material. When the vias 120 are filled, they may electrically couple electrical traces of electrical components disposed on the first major surface 110 and the second major surface 112 of the substrate 100.

The geometry of the vias 120 may play a role in the quality of the resulting filling of the vias 120. The interior shape (i.e., profile) of the vias 120 may play significant roles in the success of the metallization process. For example, vias that are too "hourglass" in shape can lead to poor metallization and inadequate electrical performance after metallization. Metallization processes, such as vacuum deposited coatings, often have line-of-sight issues, meaning that applied coatings cannot reach the innermost areas of rough texture, or the lower region of an hourglass shaped via, because some points in the surface "shadow" others from the coating process. The same hourglass shapes can also lead to reliability issues post metallization, such as where cracking and other failures can occur when the part is subjected to environmental stress such as thermal cycling. Additionally, along the top and bottom surface of the article, depressions or mounds near the entrance and/or exit of the vias 120 can also lead to plating, coating, and bonding issues when redistribution layer processes are applied. Accordingly, tight control of the morphology of the holes should be present to fabricate a technically viable product. Embodiments of the present disclosure provide for articles having desired geometric attributes, tolerances, and example fabrication processes for achieving articles having such geometric attributes and tolerances.

While specific reference has been made herein to vias 120 with different cross-sectional geometries through the thickness of the substrate 100, it should be understood that the vias 120 may include a variety of other cross-sectional geometries and, as such, the embodiments described herein are not limited to any particular cross-sectional geometry of the vias 120. Moreover, while the vias 120 are depicted as having a circular cross section in the plane of the substrate 100, it should be understood that the vias 120 may have other planar cross-sectional geometries. For example, the vias 120 may have various other cross sectional geometries in the plane of the substrate 100, including, without limitation, elliptical cross sections, square cross sections, rectangular cross sections, triangular cross sections, and the like. Further, it should be understood that vias 120 with different cross sectional geometries may be formed in a single interposer panel.

Figure 3E:
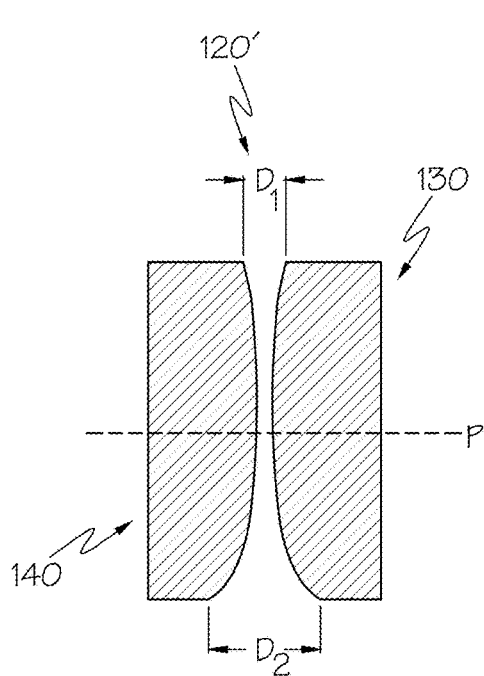
FIG. 3E schematically depicts a cross-sectional side view of yet another via geometry according to one or more embodiments shown and described herein.
Figure 3F:
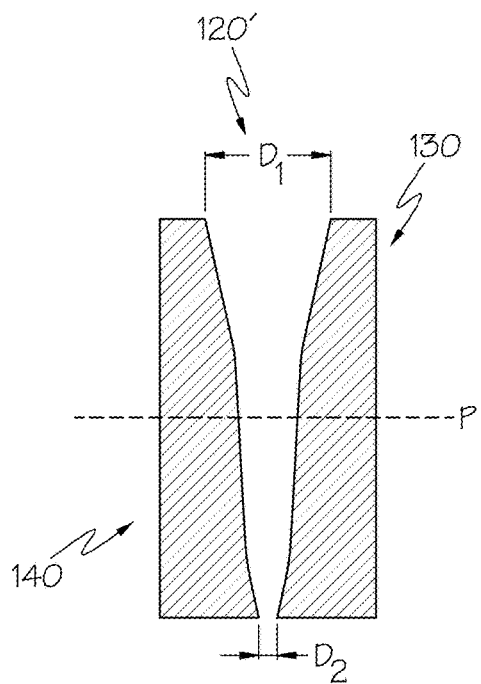
FIG. 3F schematically depicts a cross-sectional side view of yet another via geometry according to one or more embodiments shown and described herein.
Figure 3G:
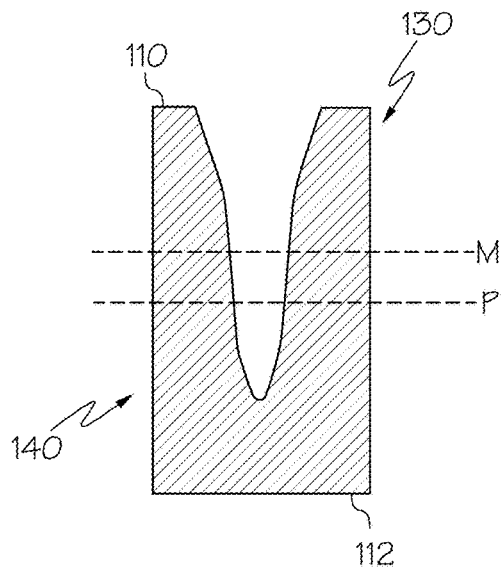
FIG. 3G schematically depicts a cross-sectional side view of an illustrative tapered via having a particular via geometry according to one or more embodiments shown and described herein.

FIGS. 3A-3G schematically depict various illustrative vias within a substrate 100 in isolation. FIGS. 3A, 3C, 3D, 3E, and 3F each depict through-glass-vias and FIG. 3G depicts a blind via. It should be understood that the portions of the description provided herein may be particularly directed to a specific one of FIGS. 3A-3G, but are generally applicable to any of the various embodiments depicted with respect to FIGS. 3A-3G, unless specifically stated otherwise.

FIG. 3A depicts a cross-sectional side view of an illustrative via 120 according to an embodiment. The via 120 may generally be a through-glass-via because it extends an entire distance through the substrate 100 between the first major surface 110 and the second major surface 112 of the substrate 100. The first major surface 110 and the second major surface 112 may generally be parallel to one another and/or spaced a distance apart from each other. In some embodiments, the distance between the first major surface 110 and the second major surface 112 may correspond to the average thickness T (FIG. 2A). The tapered via 120 may generally include an interior wall 122 that extends the entire length of the tapered via 120. That is, the interior wall 122 extends from the first major surface 110 to the second major surface 112 of the substrate 100. The interior wall 122 includes a plurality of tapered regions, where each tapered region is distinguished from the other tapered regions by its relative slope, as described in greater detail herein. In a nonlimiting example, FIG. 3A depicts the interior wall 122 as having a first tapered region 124, a second tapered region 126, and a third tapered region 128, where each of the first tapered region 124, the second tapered region 126, and the third tapered region 128 have a different slope. It should be understood that the interior wall 122 may have greater or fewer tapered regions without departing from the scope of the present disclosure.

Each of the first tapered region 124, the second tapered region 126, and the third tapered region 128 may generally extend in a direction from the first major surface 110 towards the second major surface 112. While in some embodiments, a tapered region may extend in a direct line that is perpendicular to the first major surface 110 and the second major surface 112, this is not always the case. That is, in some embodiments, a tapered region may extend at an angle from the first major surface 110, but generally towards the second major surface 112. Such an angle may be referred to as a slope of a particular tapered region.

The slope of each of the various tapered regions (including the first tapered region 124, the second tapered region 126, and the third tapered region 128) of the interior wall 122 is not limited by this disclosure. That is, each of the tapered regions 124, 126, 128 may have any slope as calculated by any image processing software that is particularly configured to obtain an image of the tapered regions 124, 126, 128, extract a profile of the tapered regions 124, 126, 128 from the obtained image, and determine the slope from the profile at a particular point, at a plurality of points, and/or at a particular region. One such illustrative example of image processing software may include, but is not limited to, Igor Pro (WaveMetrics, Inc., Portland Oreg.).

Figure 14A:
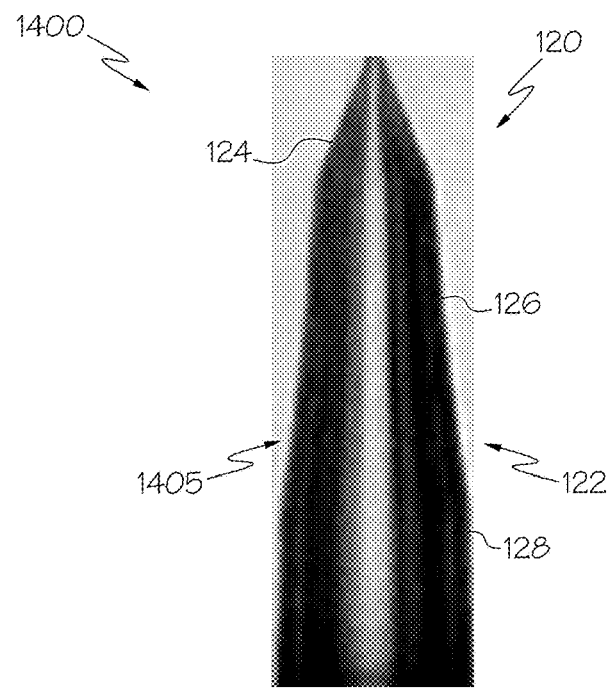
FIG. 14A depicts an image of a cross-sectional view of an illustrative tapered via according to one or more embodiments shown and described herein.

More specifically, an image 1400 of the profile 1405 of the via 120 may be obtained, as depicted in FIG. 14A. In order to obtain such an image 1400, the substrate 100 (FIG. 3A) must be sliced in a direction extending between the first major surface 110 and the second major surface 112 (FIG. 3A) through the via 120 such that a cross-section of the via 120 is visible. Optical microscopy, a scanning electron microscope (SEM), or the like may then be used to obtain an image 1400 of the profile 1405 of the via 120.

Figure 14B:
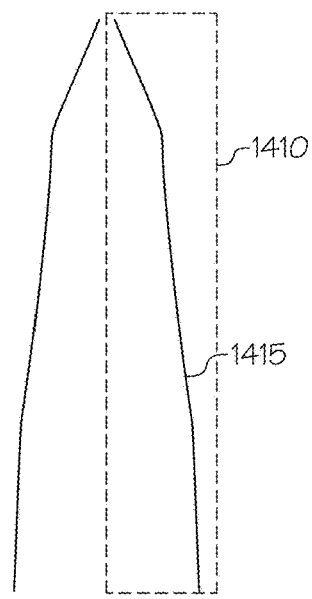
FIG. 14B schematically depicts a computer-aided tracing of the interior walls of the illustrative tapered via depicted in FIG. 14A.

Referring to both FIGS. 14A and 14B, a region of interest 1410 (indicated by the dashed lines forming a box) may be selected. In some embodiments, the region of interest 1410 may include the entire via 120. In other embodiments, the region of interest 1410 may only contain a portion of the via 120. For example, if the via 120 is a symmetrical via, only half of the via 120 may be selected as the region of interest 1410 (e.g., a portion of the via 120 extending from the first major surface 110 to a plane P, as shown in FIG. 3A). After selecting the region of interest 1410, the interior wall 122 of the via 120 (including the various tapered regions 124, 126, 128) may be electronically traced using computer software to obtain a traced line 1415. The traced line 1415 may be drawn overtop the image 1400 of the profile 1405 such that the contour of the traced line 1415 corresponds to the contour of the interior wall 122 of the via 120 in the image 1400. Such a drawing containing the traced line 1415 may be completed using standard edge detection techniques that are available from commercially available data/image processing software, as described in greater detail herein.

Figure 15A:
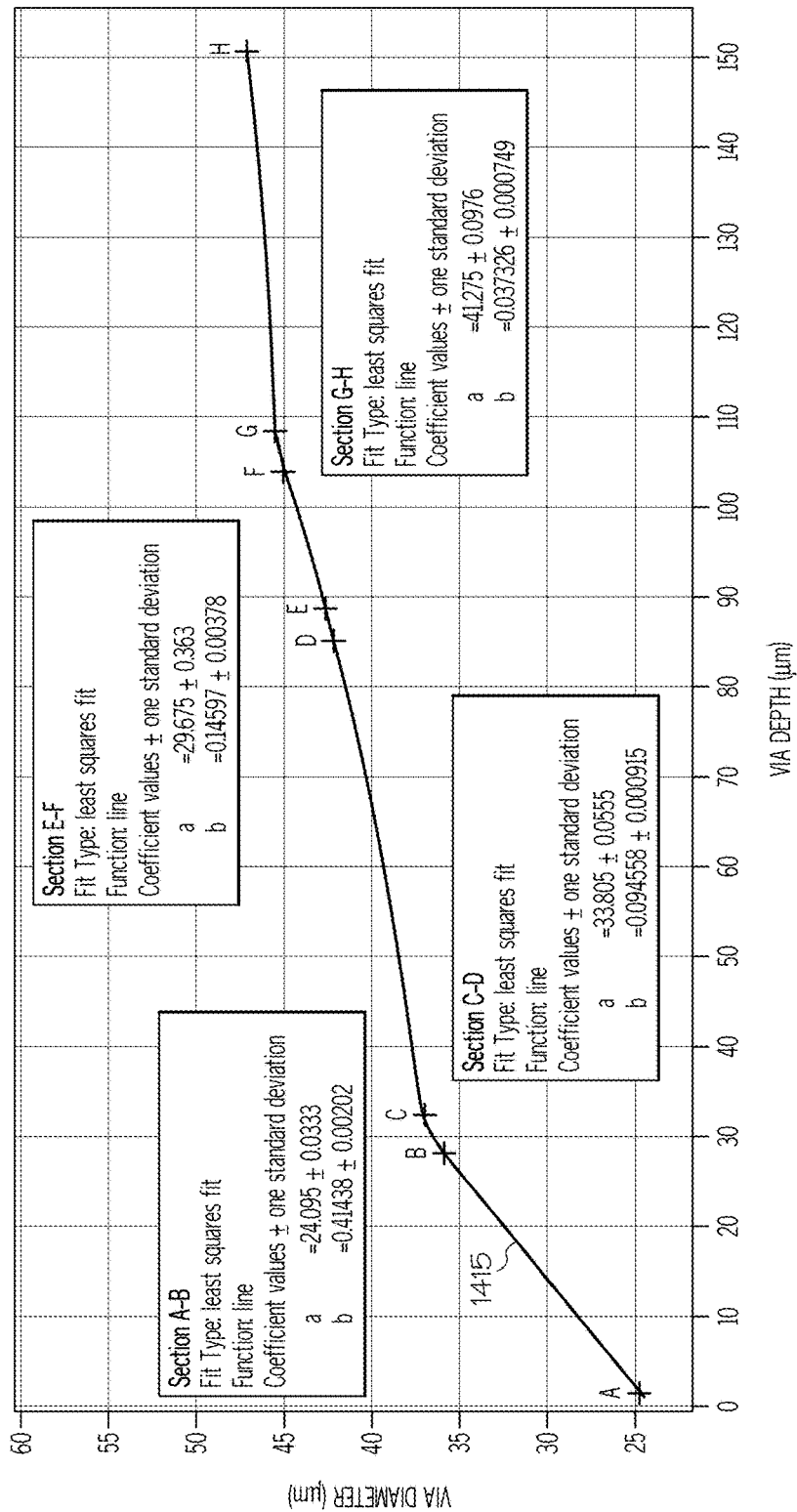
FIG. 15A graphically depicts a plurality of tapered regions of the illustrative tapered via depicted in FIG. 14A as determined by a computer program according to one or more embodiments shown and described herein.
Figure 15B:
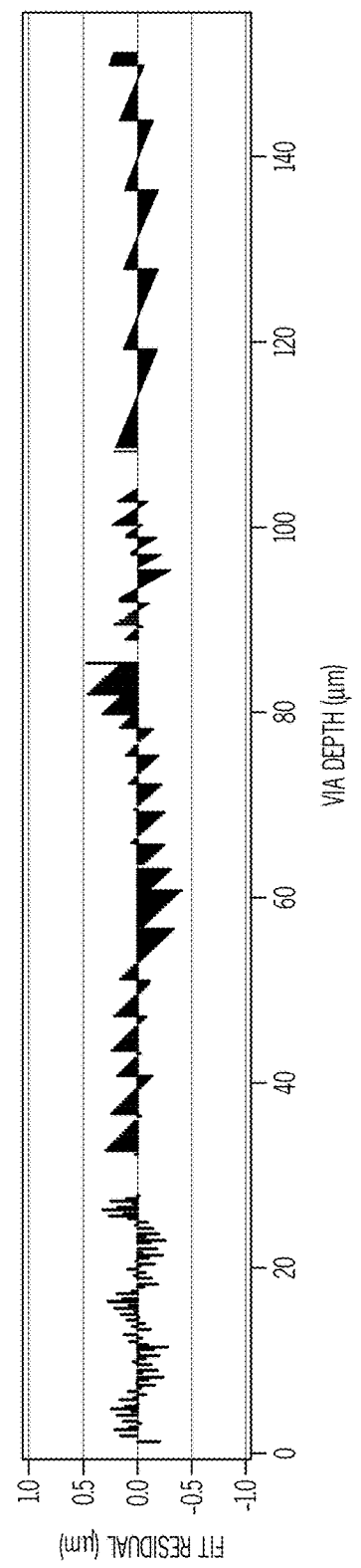
FIG. 15B graphically depicts an absolute value of an illustrative fit residual of the graph depicted in FIG. 15A according to one or more embodiments shown and described herein.

The traced line 1415 may then be analyzed to determine the slope of one or more portions of the interior wall 122 (including the various tapered regions 124, 126, 128). For example, as depicted in FIG. 15A, the traced line 1415 is graphically depicted and the computer software described herein is used to determine one or more straight regions of the traced line 1415. A straight region is defined as follows: (1) the length of the region is no less than 5 µm, and may generally be greater than 10 µm; (2) the region can be fit to a linear function (y=a+bx) using a least squares fit with x being the depth (distance from the surface) and y being the radius of the via at depth x, wherein the absolute value of the least squares fit residual is less than 1 µm (as indicated by the corresponding graph in FIG. 15B, wherein the residual is the difference between the actual radius (y) at a given depth (x) and the fitted radius (y) at a given depth (x)); and (3) the slope of the fit function for any adjacent region should be different by at least 0.01, which translates to a 0.57 degree difference in terms of tapered angle. A region meeting all of the criteria (1), (2), and (3) described above is referred to as a region having a constant slope. As shown in FIG. 15A, the traced line 1415 has four distinct straight regions: the region between points A and B, the region between points C and D, the region between points E and F, and the region between points G and H. As such, the slope of the regions between points A and B, between points C and D, between points E and F, and between points G and H is constant. In addition, the areas of the traced line 1415 between points B and C, between points D and E, and between points F and G may be transition areas between the areas of constant slope, as described in greater detail herein.

Referring again to FIG. 3A, in some embodiments, the slope of each tapered region may be an angle relative to a particular axis at a particular point. For example, in some embodiments, the slope may be an angle relative to an axis that is substantially parallel to the first major surface 110 and/or the second major surface 112. In other embodiments, the slope of each tapered region may be an angle relative to an axis that is substantially perpendicular to the first major surface 110 and/or the second major surface 112. In some embodiments, the slope of each tapered region may be expressed as a ratio relative to axes that are perpendicular and parallel to the first major surface 110 and/or the second major surface 112. For example, the slope of a particular tapered region may be expressed as a ratio of 3:1, which generally means the slope is a hypotenuse of a right triangle that has a first leg extending 3 units in a first direction that is perpendicular to the first major surface 110 and/or the second major surface 112 and a second leg extending 1 unit in a second direction that is parallel to the first major surface 110 and/or the second major surface 112. Illustrative slopes of tapered regions (including the first tapered region 124, the second tapered region 126, and the third tapered region 128) may be from about 3:1 to about 100:1, including about 3:1, about 4:1, about 5:1, about 6:1, about 7:1, about 8:1, about 9:1, about 10:1, about 20:1, about 30:1, about 40:1, about 50:1, about 60:1, about 70:1, about 80:1, about 90:1, about 100:1, or any value or range between any two of these values (including endpoints).

In various embodiments, a transition area between the slope of each of the tapered regions may occur in any instance where a region of constant slope of the interior wall 122 ends. Examples of transition areas are the regions of the traced line 1415 between points B and C, between points D and E, and between points F and G. In some embodiments, the slope of the transition area varies from the slope of the region of constant slope by greater than or equal to about 0.57 degrees, greater than or equal to about 1 degree, greater than or equal to about 2 degrees, greater than or equal to about 3 degrees, greater than or equal to about 4 degrees, or greater than or equal to about 5 degrees. For example, as shown in FIG. 3B, a transition area from the slope of the second tapered region 126 to the slope of the third tapered region 128 may occur at a point where the slope of the tangent line 155 of the interior wall 122 changes at least 0.57 degrees from the constant slope of the second tapered region 126. The location of the point may generally be determined by the aforementioned image processing software in traversing successive points on the interior wall 122 in a direction away from one of the tapered regions, measuring each of the successive points, and determining whether each of the successive points changes at least 0.57 degrees from the slope of the tapered region preceding the particular successive point. In some embodiments, such a transition area may be demarcated by a particular point 150. In other embodiments, such a transition area may be an extended region. That is, the transition area is gradual such that the transition between the slope of the second tapered region 126 to the slope of the third tapered region 128 does not occur at a particular point, but rather occurs in a region where an average slope of the interior wall 122 within the transition area is greater than or equal to about 0.57 degrees of variation from the second tapered region 126 and the third tapered region 128.

In some embodiments, the transition area between the tapered regions may be pronounced, as shown in FIGS. 3A, 3C, 3F, and 3G. That is, the transition region may be a particular point 150 (FIG. 3B) or a region that is relatively short in length such that it may be easier to discern where each tapered region begins and ends relative to the other tapered regions. In other embodiments, the transition area between the tapered regions may be larger, as shown in FIGS. 3D and 3E such that the slope of the interior wall 122 appears to be continuously changing and it may be more difficult to discern where each tapered region begins and ends relative to the other tapered regions. For example, as shown in FIG. 3D, the transition area between the slope of the first tapered region 124 and the second tapered region 126 may be longer relative to the transition area between the slope of the first tapered region 124 and the second tapered region 126 as shown in FIG. 3A.

The length of each of the various tapered regions may vary, and are generally not limited by this disclosure. The length of each of the various tapered regions may be based on the number of tapered regions, the distance between the first major surface 110 and the second major surface 112, the slope of each tapered region, the size of the transition between tapered regions, and/or the like. A length of each particular region may be based on the endpoints for each particular region, as described in greater detail herein. For example, the first tapered region 124 may have a first endpoint that is located at the intersection of the interior wall 122 with the first major surface 110 and a second endpoint that is a point on the interior wall 122 where a constant slope of the interior wall 122 ends, for example the slope varies by at least 0.57 degrees from the slope of the first tapered region 124. Similarly, the second tapered region 126 may extend from an intersection with the first tapered region 124 towards the second major surface 112. It should be understood that the length, as used herein with respect to the various tapered regions (including a total length that includes all tapered regions combined), refers to a length of the interior wall 122 as it is traversed when following the contour/profile of the interior wall 122 from a start point to an end point.

In some embodiments, a length of a particular tapered region (including the first tapered region 124, the second tapered region 126, and/or the third tapered region 128) may be from about 15 microns to about 360 microns, including about 15 microns, about 25 microns, about 50 microns, about 75 microns, about 100 microns, about 150 microns, about 200 microns, about 250 microns, about 300 microns, about 350 microns, about 360 microns, or any value or range between any two of these values (including endpoints).

The via 120 may be symmetrical or asymmetrical about a plane P that is located between the first major surface 110 and the second major surface 112 and is equidistant between the first major surface 110 and the second major surface 112 (e.g., midheight between the first major surface 110 and the second major surface). In addition, the plane P may further be substantially parallel to the first major surface 110 and the second major surface 112.

When the via 120 is symmetrical about the plane P, the various tapered regions of the interior wall 122 in a first portion 130 between the plane P and the first major surface 110 may be a mirror image of the various tapered regions of the interior wall 122 in a second portion 140 between the plane P and the second major surface 112. That is, at any given distance from the plane P in the first portion 130, a diameter of the via 120 will be substantially equal to a diameter of the via 120 at a corresponding distance from the plane P in the second portion 140. For example, as shown in FIGS. 3A and 3D, a first diameter $D_1$ of the via 120 at an opening of the via 120 at the first major surface 110 in the first portion 130 is substantially equal to a second diameter $D_2$ of the via 120 at the opening of the via 120 at the second major surface 112. As used herein with respect to the symmetrical shape, the term "substantially equal" refers to diameters that are equal within a tolerance limit. The tolerance limit may be less than or equal to 3 microns, less than or equal to about 2 microns, less than or equal to 1 micron, less than or equal to about 0.5 microns, less than or equal to about 0.25 microns, less than or equal to about 0.1 microns, or equal to about 0 microns.

In contrast, as shown in FIGS. 3C, 3E, and 3F, when another via 120' is asymmetrical about the plane P, the various tapered regions of the interior wall 122 in the first portion 130 are not a mirror image of the various tapered regions of the interior wall 122 in the second portion 140. That is, as shown in FIGS. 3C, 3E, and 3F, the first diameter $D_1$ of the via 120' at any given location on the first portion 130 is not equal to a second diameter $D_2$ of the via 120' at the corresponding location in the second portion 140. As particularly depicted in the blind via of FIG. 3G, the via 120' is asymmetrical because the first portion 130 on the one side of the plane P is not a mirror image of the second portion 140 below the plane P. Moreover, the via 120', by virtue of being a blind via, does not contain an opening on the second major surface 112. Rather, the via 120' only contains an opening on the first major surface 110.

Figure 4:
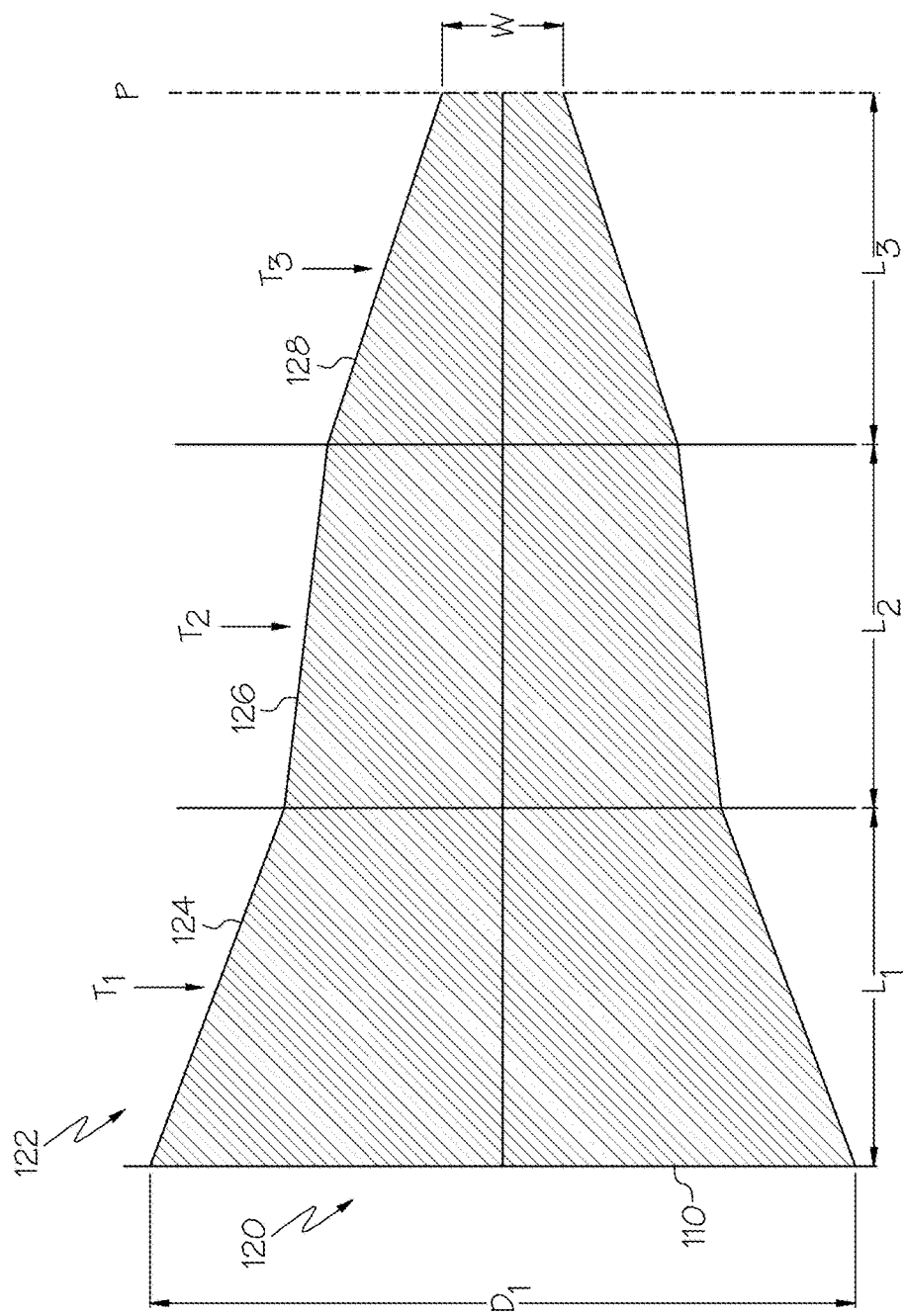
FIG. 4 schematically depicts a cross-sectional side view of a portion of an illustrative taper, indicating lengths of various tapered regions of an interior wall thereof according to one or more embodiments shown and described herein.

As shown in FIG. 4, the via 120 may have a particular waist diameter W at the plane P. In some embodiments, the waist diameter W may be greater than or equal to about 80% of a largest of the first diameter $D_1$ and the second diameter (not shown). In other embodiments, the waist diameter W may be within a range of about 20% to about 100% of a largest of the first diameter $D_1$ and the second diameter. In other embodiments, the waist diameter W may be about 85% of a largest of the first diameter $D_1$ and the second diameter, about 90% of a largest of the first diameter $D_1$ and the second diameter, about 30% to about 100% of a largest of the first diameter $D_1$ and the second diameter, about 40% to about 100% of a largest of the first diameter $D_1$ and the second diameter, about 50% to about 100% of a largest of the first diameter $D_1$ and the second diameter, about 60% to about 100% of a largest of the first diameter $D_1$ and the second diameter, about 70% to about 100% of a largest of the first diameter $D_1$ and the second diameter, about 80% to about 100% of a largest of the first diameter $D_1$ and the second diameter, or about 90% to about 100% of a largest of the first diameter $D_1$ and the second diameter. In some embodiments, the waist diameter may be from about 5 microns to about 200 microns, including about 5 microns, about 10 microns, about 25 microns, about 50 microns, about 100 microns, about 200 microns, or any value or range between any two of these values (including endpoints).

Figure 5A:
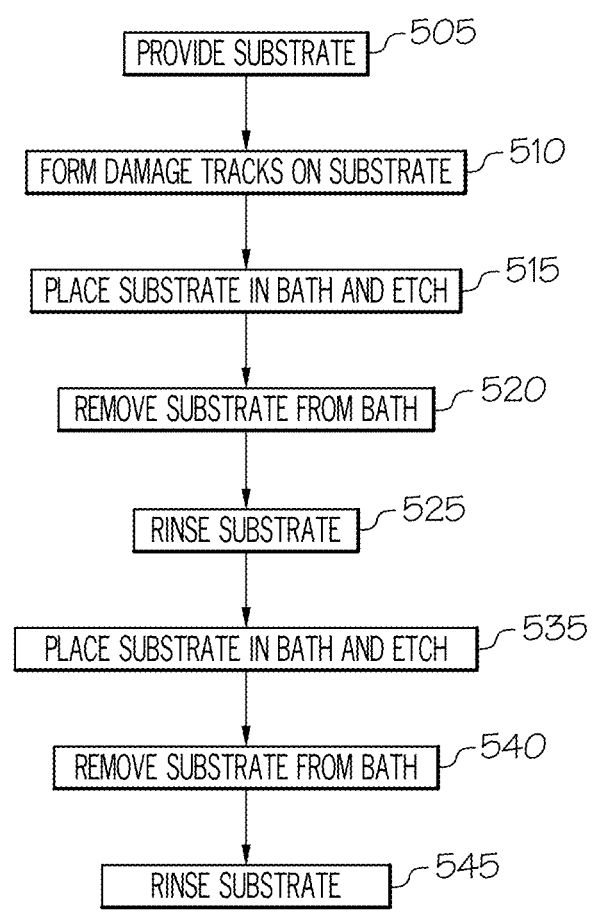
FIG. 5A depicts a flow diagram of an illustrative method of forming a glass article according to one or more embodiments shown and described herein.

FIG. 5A depicts an illustrative method of forming a glass-based substrate that includes at least one symmetrical tapered via according to one or more embodiments. The steps shown in FIG. 5A are merely exemplary, and steps may be excluded or additional steps included. In some embodiments, the glass-based substrate formed from the method described with respect to FIG. 5A may include a through via having an interior wall with a plurality of tapered regions and a cross section that is symmetrical about a plane, as described in greater detail herein.

At step 505, a planar glass-based substrate may be provided. As described herein, the glass-based substrate may generally be any glass-based substrate that is suitable for creation of vias therethrough. The glass-based substrate may have any suitable thickness and/or shape, for example, a 0.7 millimeter (mm) thick 150 mm diameter wafer.

At step 510, one or more laser damage regions or pilot holes may be formed in the glass-based substrate. The laser damage region creates a damages area within substrate 100 that etches at a faster etch rate than non-damaged regions upon application of an etching solution. The one or more damage tracks may be formed via a line-focused laser, such as that described in U.S. Patent Publication No. 2015/0166395, which is hereby incorporated by reference in its entirety. However, the present disclosure is not limited to such a laser, and the one or more damage tracks may be formed with other lasers without departing from the scope of the present disclosure. The energy density of the laser (e.g., the energy delivered to the glass-based substrate) may be chosen such that it is above a damage threshold along at least a portion of the glass-based substrate (e.g., along an entire width of the glass-based substrate if a through-glass-via is desired) and along an entire axis of the laser. In embodiments where a blind via is desired, forming the one or more damage tracks may include forming a first set of damage tracks on the first major surface of the substrate and a second set of damage tracks on the second major surface such that the energy delivered to the glass-based substrate is above the damage threshold in the first set of damage tracks and below the damage threshold for the second set of damage tracks. Other means of forming one or more damage tracks on the glass-based substrate should generally be understood and are intended to be included within the scope of the present disclosure.

Forming the damage tracks may include any forming technique, and the present disclosure is not limited to any particular technique. Illustrative forming techniques may include, but are not limited to, mechanical drilling, etching, laser ablation, laser assisted processes, laser damage and etching processes, abrasive blasting, abrasive water jet machining, focused electro-thermal energy, or any other suitable forming technique.

At step 515, the glass-based substrate is exposed to an etchant, for example by placement in an etchant bath (e.g., a first etchant bath) and etched at a particular etch rate (e.g., a first etch rate) to remove the laser damaged region and/or enlarge the pilot hole to create at least a portion of a via. In other embodiments, exposure to an etchant may be achieved through any conventional means including, but not limited to, spraying with etchant, or applying an etchant cream. The first etchant may be, for example, an acid etchant or a base etchant. Illustrative examples of acid etchants include, but are not limited to, etchants that contain an amount of nitric acid ($HNO_3$), etchants that contain hydrofluoric acid (HF), and/or the like. Illustrative examples of base etchants include, but are not limited to, etchants that are alkaline, such as sodium hydroxide (NaOH), potassium hydroxide (KOH), ammonium hydroxide ($NH_4OH$), and/or the like. In some embodiments, the first etchant bath may be a stagnant (e.g., unagitated) bath of about 9.8% (w/w) aqueous hydrofluoric acid solution. However, other etchant baths now known or later developed may also be used without departing from the scope of the present disclosure. The first etch rate is similarly not limited by this disclosure, and may be any etch rate. In some embodiments, the first etch rate may be about 2.8 nanometers per minute (nm/min) to about 3.2 nm/min, including about 2.8 nm/min, about 2.9 nm/min, about 3.0 nm/min, about 3.1 nm/min, about 3.2 nm/min, or any value or range between any two of these values (including endpoints). In a particular embodiment, the first etch rate may be about 3 nm/min. In some embodiments, step 515 may create a first tapered region of a via, as described in greater detail herein.

After a period time has elapsed and/or after a particular amount of the glass-based substrate has been removed, the glass-based substrate may be removed from the etchant (for example, an etchant bath) at step 520. In some embodiments, the particular amount of time may be, for example, about 5 minutes to about 120 minutes, including about 5 minutes, about 15 minutes, about 30 minutes, about 60 minutes, about 120 minutes, or any value or range between any two of these values (including endpoints). In a particular embodiment, the particular amount of time may be about 75 minutes. In another particular embodiment, the particular amount of time may be about 14 minutes. Other periods of time are contemplated without departing from the scope of the present disclosure. In some embodiments, the particular amount of the glass-based substrate that is removed may be, for example, about 10 microns of material to about 200 microns of material as measured from one of the first major surface and the second major surface, including about 10 microns of material, about 50 microns of material, about 100 microns of material, about 150 microns of material, about 200 microns of material, or any value or range between any two of these values (including endpoints). In particular embodiments, about 42 microns or about 180 microns of material as measured from one of the first major surface and the second major surface may be removed.

At step 525, the glass-based substrate may be rinsed of the etchant material. In some embodiments, the glass-based substrate may be rinsed with a solution containing hydrochloric acid (HCl), such as, for example, a 0.5M HCl solution. In some embodiments, the glass-based substrate may be rinsed with deionized water. In some embodiments, the glass-based substrate may be rinsed with a first rinse and subsequently rinsed with a second rinse. For example, the glass-based substrate may be rinsed with the 0.5M HCl solution and then subsequently rinsed with the deionized water solution. In some embodiments, the glass-based substrate may be rinsed for a particular period of time to ensure all etchant material has been removed and/or all of the wafer material that was removed from the etchant is separated, such as, for example, about 10 minutes. In a particular embodiment, the glass-based substrate may be rinsed in the 0.5M HCl solution for 10 minutes and subsequently rinsed with deionized water for 10 minutes.

At step 535, the glass-based substrate is exposed to an etchant, for example an etchant bath (e.g., a second etchant bath) and etched at a particular etch rate (e.g., a second etch rate). In other embodiments, exposure to an etchant may be achieved through any conventional means including, but not limited to, spraying with the etchant, or applying an etchant cream. The second etchant may be, for example, an acid etchant or a base etchant. The second etchant may generally have a concentration that is different from the first etchant. For example, the first etchant as described above may have a greater concentration of an acid etchant or a base etchant than the second etchant. In other embodiments, the first etchant may have a lower concentration of an acid etchant or a base etchant than the second etchant. In a particular embodiment, the second etchant bath may be a 6M NaOH solution. However, other etchant now known or later developed may also be used without departing from the scope of the present disclosure. The second etch rate is similarly not limited by this disclosure, and may be any etch rate. In a particular embodiment, the second etch rate may be about 30 nm/min. In some embodiments, the first etch rate as described above may be greater than the second etch rate. In other embodiments, the first etch rate may be less than the second etch rate. In some embodiments, step 535 may create a second tapered region of a via, as described in greater detail herein.

After a period time has elapsed and/or after a particular amount of the glass-based substrate has been removed, the glass-based substrate may be removed from the etchant (for example, an etchant bath) at step 540. In some embodiments, the particular amount of time may be, for example, about 3 days. In other embodiments, the particular amount of time may be about 6 hours. Other periods of time are contemplated without departing from the scope of the present disclosure. In some embodiments, the particular amount of the glass-based substrate that is removed may be, for example, about 65 microns of material as measured from one of the first major surface and the second major surface.

The etchant may have one or more other characteristics not specifically described herein. For example, in some embodiments, the etchant bath may be maintained at a particular temperature. One such illustrative temperature is about 85° C.

At step 545, the glass-based substrate may be rinsed to remove the etchant material. For example, the glass-based substrate may be rinsed with deionized water. The resulting glass-based substrate includes at least one symmetrical via having one or more geometric characteristics. For example, the resulting via may have a diameter at the first major surface and at the second major surface of about 100 microns, a waist diameter of about 40 microns, and an inside wall having a first tapered region that extends about 115 microns from the first major surface toward the second major surface at a 3:1 taper and a second tapered region that extends between an intersection with the first tapered region and a center of the substrate with a 30:1 taper.

Figure 5B:
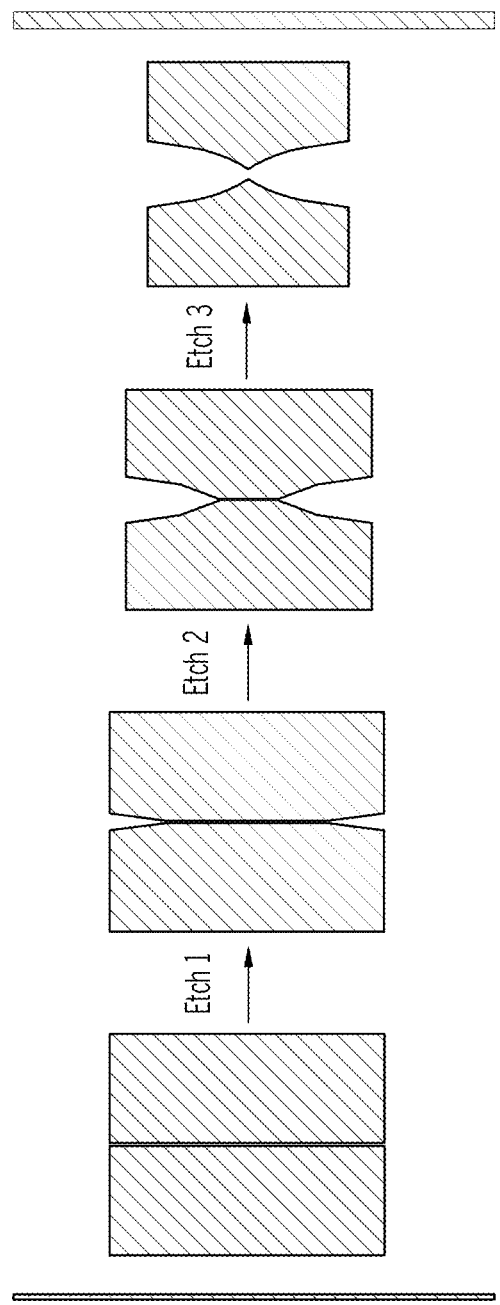
FIG. 5B schematically depicts a cross-sectional side view of an illustrative tapered via undergoing a plurality of etching processes according to one or more embodiments shown and described herein.

To create additional tapered regions, the processes depicted with respect to steps 535-545 may be repeated for each additional tapered region, as shown, for example, in FIG. 5B. It should be understood that altering one or more characteristics of the etchant bath and/or altering the etch rate may result in an additional tapered region having particular characteristics.

Example 1 below describes a specific instance of vias created using the steps described herein with respect to FIG. 5A:

EXAMPLE 1

A through-glass-via having symmetric piece-wise taper may be formed with the following steps.

Damage tracks were initially formed in 0.7 mm thick 150 mm diameter glass-based wafers using a 1064 nm picosecond laser. This energy density was chosen to be above a damage threshold of the glass-based wafers along the entire axis of the laser.

The wafers were placed in a stagnant bath of 9.8% (w/w) aqueous hydrofluoric acid solution for 75 minutes (removing ~180 microns). This process had an etch rate of about 3 (e.g., 2.8-3.2).

These wafers were then rinsed in 0.5M HCl for 10 minutes and rinsed in DI water for 10 minutes.

These wafers were then immersed in a bath of 6M sodium hydroxide at 85° C. for 3 days (removing ~65 microns). This process had an etch rate of about 30.

The process carrier were then removed from alkaline bath and rinsed with copious amounts of DI water.

This resulted in a substrate in which the vias have been opened to an entry diameter of 100 microns, a waist diameter of 40 microns, a 3:1 taper for the first 115 microns deep from the surface and a 30:1 taper for the remainder of the distance to the center of the substrate.

In some embodiments, at least a portion of the processes described with respect to FIG. 5A may also be used to create a blind via. Example 2 below depicts such an illustrative process:

EXAMPLE 2

A blind via with piecewise varying sidewall taper may be formed with the following steps:

Damage tracks were initially formed in 0.7 mm thick 150 mm diameter glass-based wafers using a 1064 nm picosecond laser. This energy density was below the damage threshold of the glass composition of the glass-based wafer toward the center of the glass and on one side.

The glass wafers were placed in a stagnant bath of 9.8% (w/w) aqueous hydrofluoric acid solution for 14 minutes (removing ~42 microns). This process had an etch rate of about 3 (e.g., 2.8-3.2).

The se wafers were then rinsed in 0.5M HCl for 10 minutes and rinsed in DI water for 10 minutes.

These wafers were then immersed in a bath of 6M sodium hydroxide at 85° C. for 6hours (removing ~6 microns). This process had an etch rate of about 30.

Carrier were then removed from alkaline bath and rinsed with copious amounts of DI water.

Figure 6:
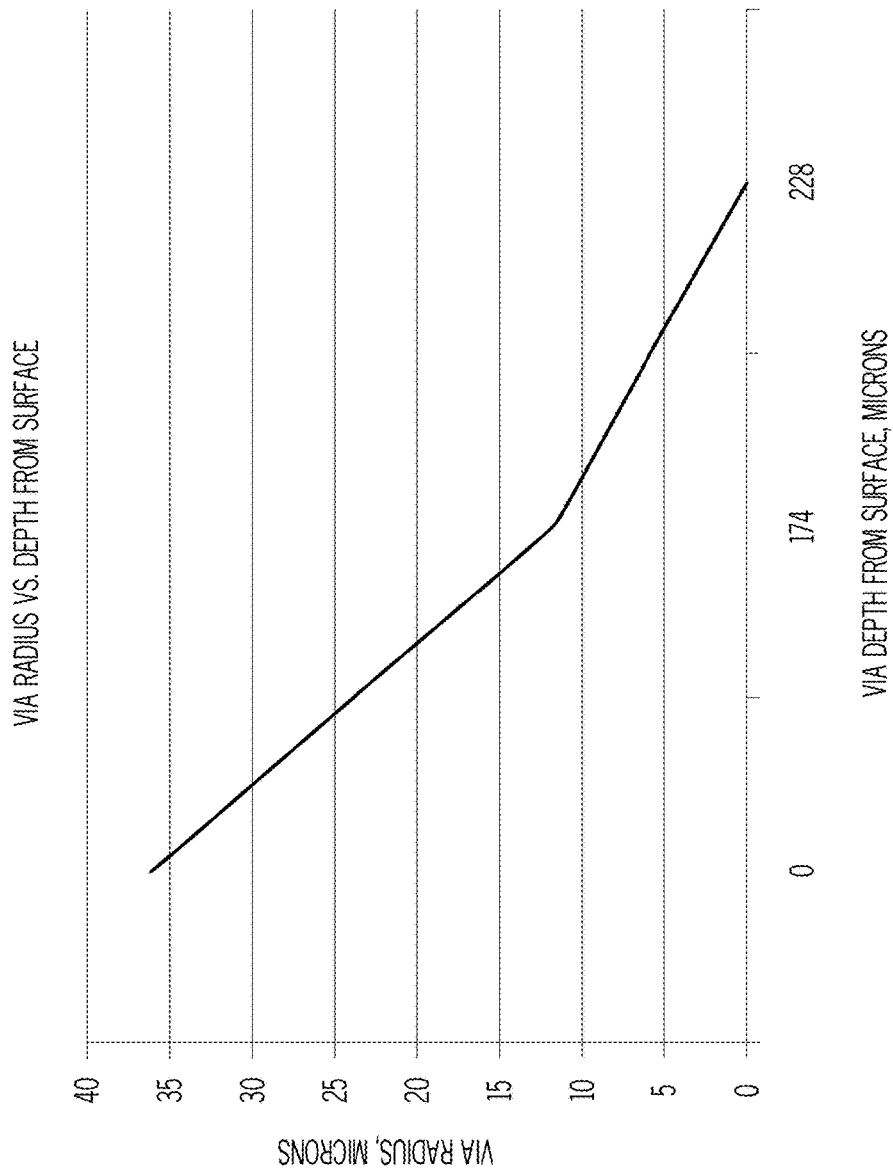
FIG. 6 graphically depicts an illustrative via radius vs. a depth from a surface of the glass article formed from the process described with respect to FIG. 5A.

This resulted in a substrate in which the vias have been opened to an entry diameter of 36 microns, a depth of 228 microns, a 3:1 taper for the first 54 microns deep from the surface and a 30:1 taper for the remainder of the distance to the end of the blind via, as depicted in FIG. 6.

Figure 7:
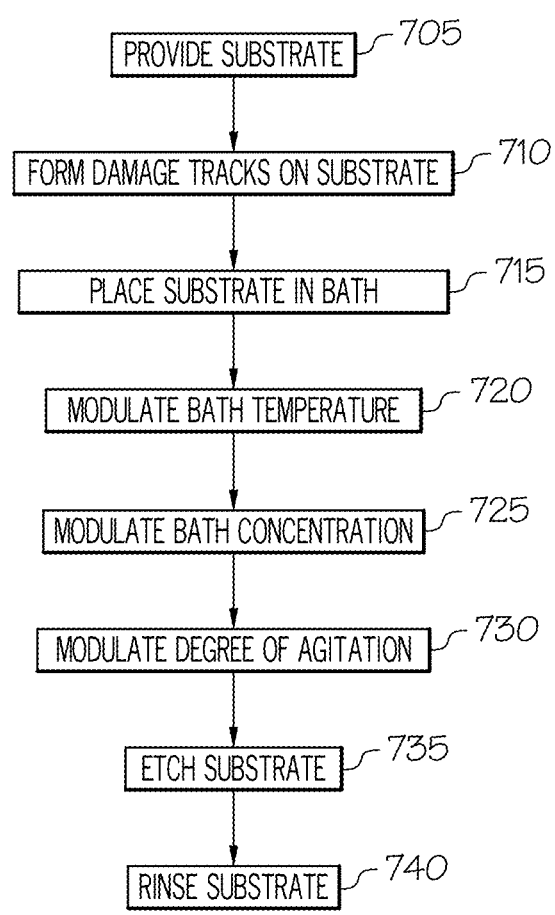
FIG. 7 depicts a flow diagram of another illustrative method of forming a glass article according to one or more embodiments shown and described herein.

FIG. 7 depicts another method of forming a glass-based substrate with one or more vias as described herein. The resulting glass-based substrate may have one or more symmetrical vias with a sidewall that continuously changes in slope, as shown for example in FIG. 3D, as opposed to the glass-based substrate formed from the method according to FIG. 5A, where the one or more vias have distinct tapered regions of varying slope, as described herein. The steps shown in FIG. 7 are merely exemplary, and steps may be excluded or additional step included. At step 705, the planar glass-based substrate may be provided. As described herein, the glass-based substrate may generally be a glass-based substrate that is suitable for creation of vias therethrough. In a particular example, the glass-based substrate may be a 0.5 mm thick 150 mm diameter wafer.

At step 710, one or more damage regions or pilot holes may be formed on the glass-based substrate, as described above with respect to step 510 in FIG. 5A. The energy density of the laser (e.g., the energy delivered to the glass-based substrate) may be chosen such that it is above a damage threshold along at least a portion of the glass-based substrate (e.g., along an entire width of the glass-based substrate if a through via is desired) and along an entire axis of the laser. In embodiments where a blind via is desired, forming the one or more damage tracks may include forming a first set of damage tracks on the first major surface of the substrate and a second set of damage tracks on the second major surface such that the energy delivered to the glass-based substrate is above the damage threshold in the first set of damage tracks and below the damage threshold for the second set of damage tracks. Other means of forming one or more damage tracks on the glass-based substrate should generally be understood and are intended to be included within the scope of the present disclosure.

At step 715, the glass-based substrate is exposed to an etchant, for example an etchant bath. In other embodiments, exposure of an etchant may be achieved through any conventional means including, but not limited to, spraying with etchant, or applying an etchant cream. The first etchant may be, for example, an acid etchant or a base etchant, as described in greater detail herein. In some embodiments, the etchant may be a stagnant bath. The etchant may generally be any solution, including an aqueous solution, water, a mixture of water and other water miscible organic solvents, such as ethylene glycol, propylene glycol, and/or the like. In some embodiments, the etchant may contain a sodium hydroxide solution. In some embodiments, the etchant may contain a potassium hydroxide solution. The concentration of the etchant may be, for example, about 4M to about 12M. In a particular embodiment, the etchant may contain about 12M aqueous sodium hydroxide solution. However, other etchants now known or later developed may also be used without departing from the scope of the present disclosure.

The etchant (for example, an etchant bath) may be initially placed at a particular temperature, and the temperature may be modulated over a period of time at step 720. That is, the etchant temperature may be increased and/or decreased over the period of time. For example, the temperature may be increased over the period of time, decreased over the period of time, increased and decreased in alternating increments over the period of time, or the like. Increasing and decreasing the temperature may occur linearly (e.g., continuously increasing or decreasing the temperature) or may occur in a stepwise fashion (e.g., increasing or decreasing the temperature a particular amount after a particular period of time has elapsed). In some embodiments, the period of time may correspond to an amount of time necessary to complete a particular etching process. The etchant temperature is not limited by this disclosure, and may generally be any temperature, particularly temperatures that are understood to be suitable for the etching processes described herein. For example, the bath temperature may be from about 95° C. to about 130° C., including about 95° C., about 100° C., about 110° C., about 120° C., about 130° C., or any value or range between any two of these values (including endpoints). The temperature of the etchant may influence the reaction time. In a particular embodiment, the etchant may be initially set to 120° C. and linearly increased to 130° C. over the course of a 12 hour period, and then left at a constant temperature of 130° C. for about 22 hours.

In some embodiments, a concentration of the acid or base etchant in the etchant (for example, an etchant bath) may be modulated at step 725. That is, the concentration of etchant in the bath may be increased and/or decreased over the period of time. For example, the concentration may be increased over the period of time, decreased over the period of time, increased and decreased in alternating increments over the period of time, or the like. Increasing and decreasing the concentration may occur linearly (e.g., continuously increasing or decreasing the concentration) or may occur in a stepwise fashion (e.g., increasing or decreasing the concentration a particular amount after a particular period of time has elapsed). In some embodiments, the period of time may correspond to an amount of time necessary to complete a particular etching process. The etchant concentration is not limited by this disclosure, and may generally be any concentration of etchant, particular etchant concentrations that are understood to be suitable for the etching processes described herein.

In some embodiments, a degree of agitation exerted on an etchant bath may be modulated at step 730. That is, the etchant bath may be agitated more or less vigorously over the period of time. Agitation may be completed via generally understood agitation processes, such as, for example, mechanical agitation, sonication, conventional mixing, conventional stirring, and any combination thereof The degree of agitation may be increased over the period of time, decreased over the period of time, increased and decreased in alternating increments over the period of time, or the like. Increasing and decreasing the degree of agitation may occur linearly (e.g., continuously increasing or decreasing the degree of agitation) or may occur in a stepwise fashion (e.g., increasing or decreasing the degree of agitation a particular amount after a particular period of time has elapsed). In some embodiments, the period of time may correspond to an amount of time necessary to complete a particular etching process. The degree of agitation is not limited by this disclosure, and may generally be any degree of agitation, particular etchant degrees that are understood to be suitable for the etching processes described herein.

At step 735, the substrate may be etched. It should be understood that the etching process may occur as soon as the substrate is exposed to the etchant at step 715 and may continue to occur during the various modulation processes as described hereinabove. After etching has occurred, the substrate may be removed from the bath. The period of time necessary for etching is not limited by this disclosure, and may generally be any period of time necessary to complete the etching as described herein. For example, the period of time may be, but is not limited to, from about 10 hours to about 200 hours, including about 10 hours, about 50 hours, about 100 hours, about 150 hours, about 200 hours, or any value or range between any two of these values (including endpoints).

At step 740, the glass-based substrate may be rinsed of the etchant material, as described herein. For example, the glass-based substrate may be rinsed with the 0.5M HCl solution and then subsequently rinsed with the deionized water solution. In a particular embodiment, the glass-based substrate may be rinsed in the 0.5M HCl solution for 10 minutes and subsequently rinsed with deionized water for 10 minutes.

Example 3 depicts a via formed according to various processes described with respect to FIG. 7.

EXAMPLE 3

Figure 8:
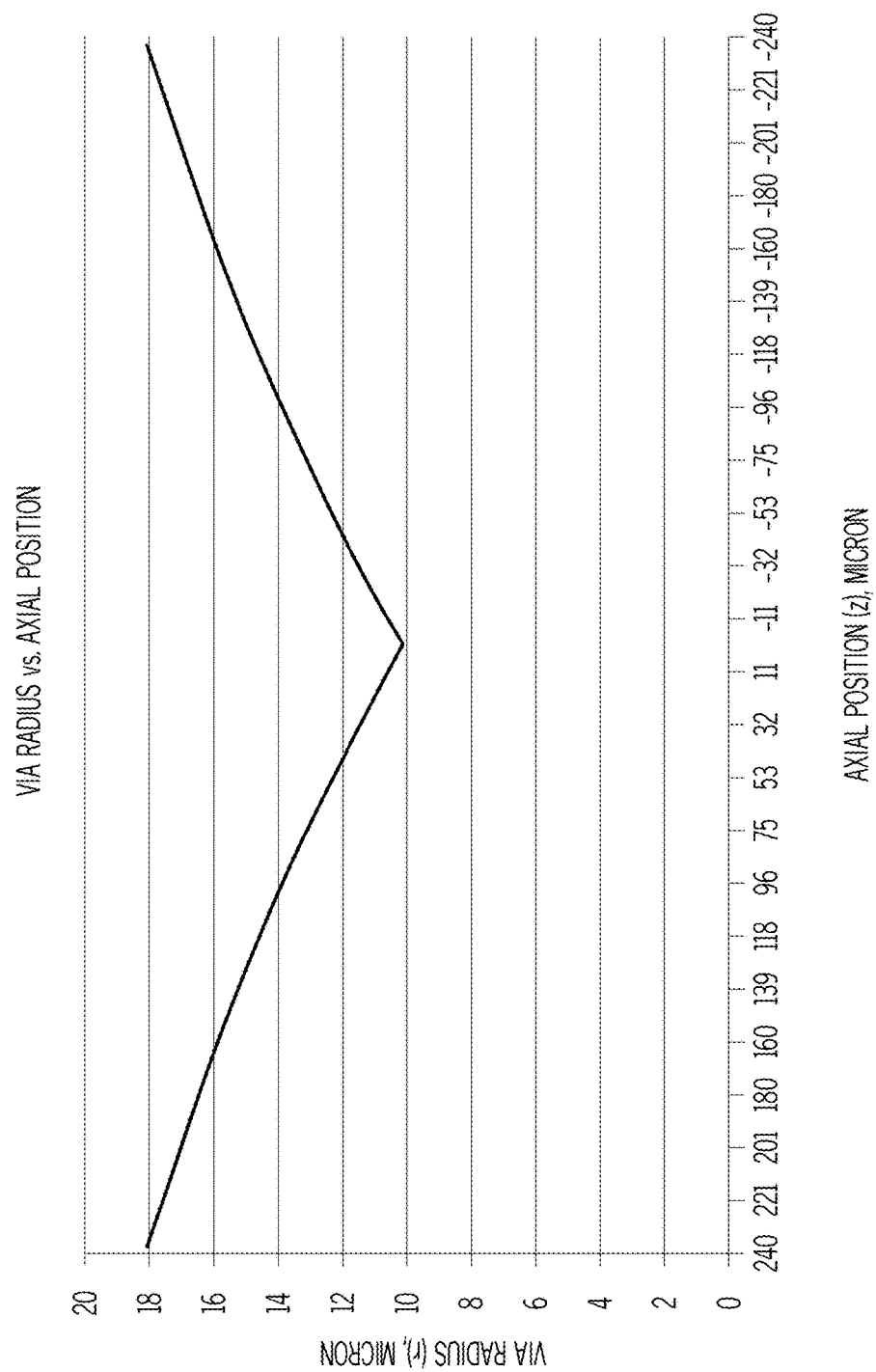
FIG. 8 graphically depicts an illustrative via radius vs. an axial position of one of the glass articles formed from the process described with respect to FIG. 7.

A through-glass-via having symmetric piece-wise taper may be formed with the following steps:
- Damage tracks were initially formed in 0.5 mm thick 150 mm diameter glass-based wafers using a 1064 nm picosecond laser. This energy density was chosen to be above the damage threshold of the glass-based wafer along the entire axis of the laser.
- The wafers were placed in a stagnant bath of 12M aqueous sodium hydroxide solution. The temperature was initially set to 120° C. but was increased linearly to 130° C. over the course of 12 hours.
- The wafers were then etched for another 22 hours at a constant temperature 130° C.
- These wafers were then rinsed in 0.5M HCl for 10 minutes and rinsed in DI water for 10 minutes. This created a via with the profile as shown in FIG. 8.

Example 4 depicts another via formed according to various processes described with respect to FIG. 7.

EXAMPLE 4

Figure 9:
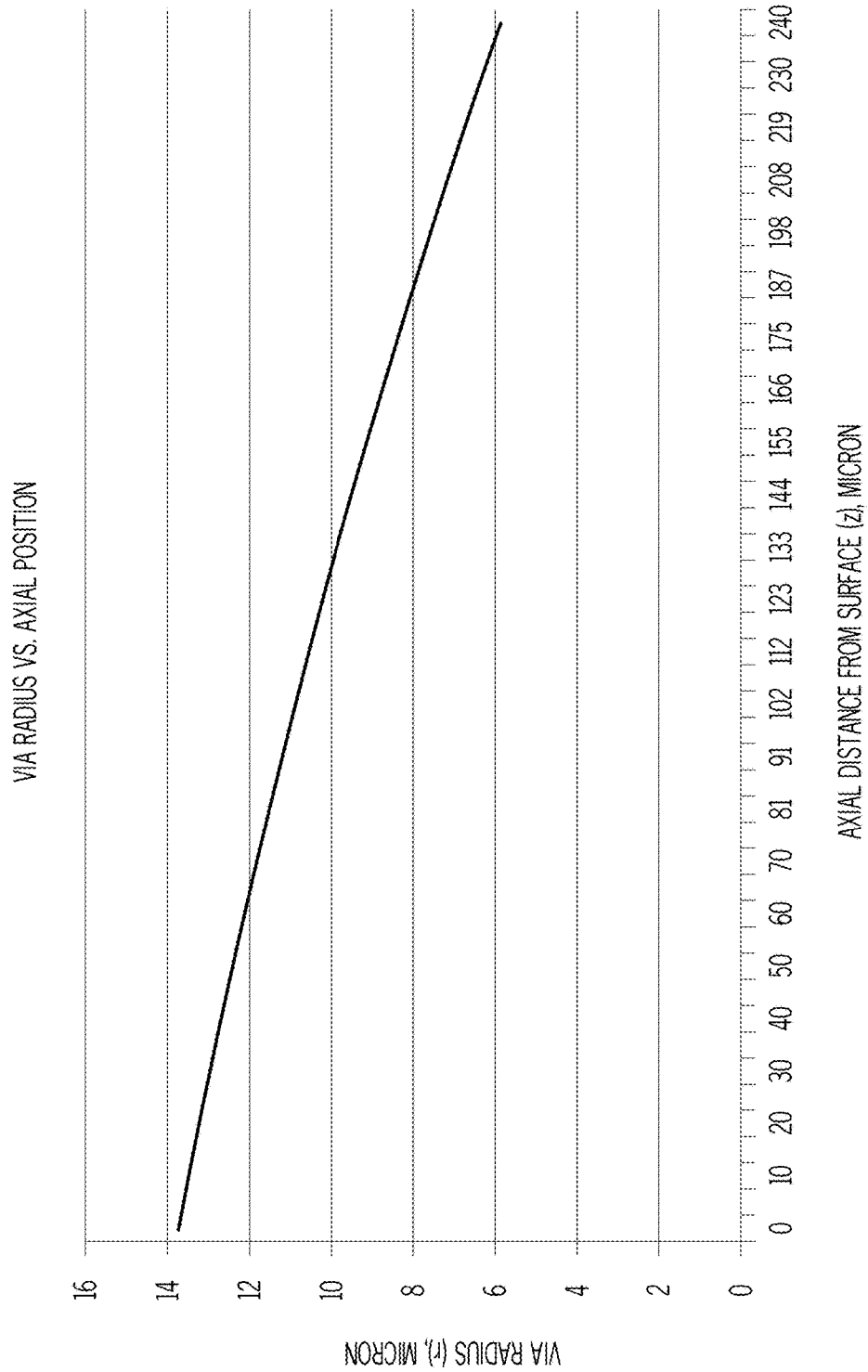
FIG. 9 graphically depicts another illustrative via radius vs. an axial position of another one of the glass articles formed from the process described with respect to FIG. 7.

A blind via with continuously varying sidewall taper may be formed with the following steps:
- Damage tracks were initially formed in 0.7 mm thick 150 mm diameter glass-based wafers using a 1064 nm picosecond laser. This energy density was below the damage threshold of the glass-based wafer composition toward the center of the glass and on one side.
- The wafers were placed in a stagnant bath of 12M aqueous sodium hydroxide solution. The temperature was initially set to 120° C. but is increased linearly to 130° C. over the course of 12 hours.
- The wafers were then rinsed in 0.5M HCl for 10 minutes and rinsed in DI water for 10 minutes.
- This resulted in a substrate in which the vias have been opened to an entry diameter of 16 microns and a sidewall profile as depicted in FIG. 9.

Figure 10:
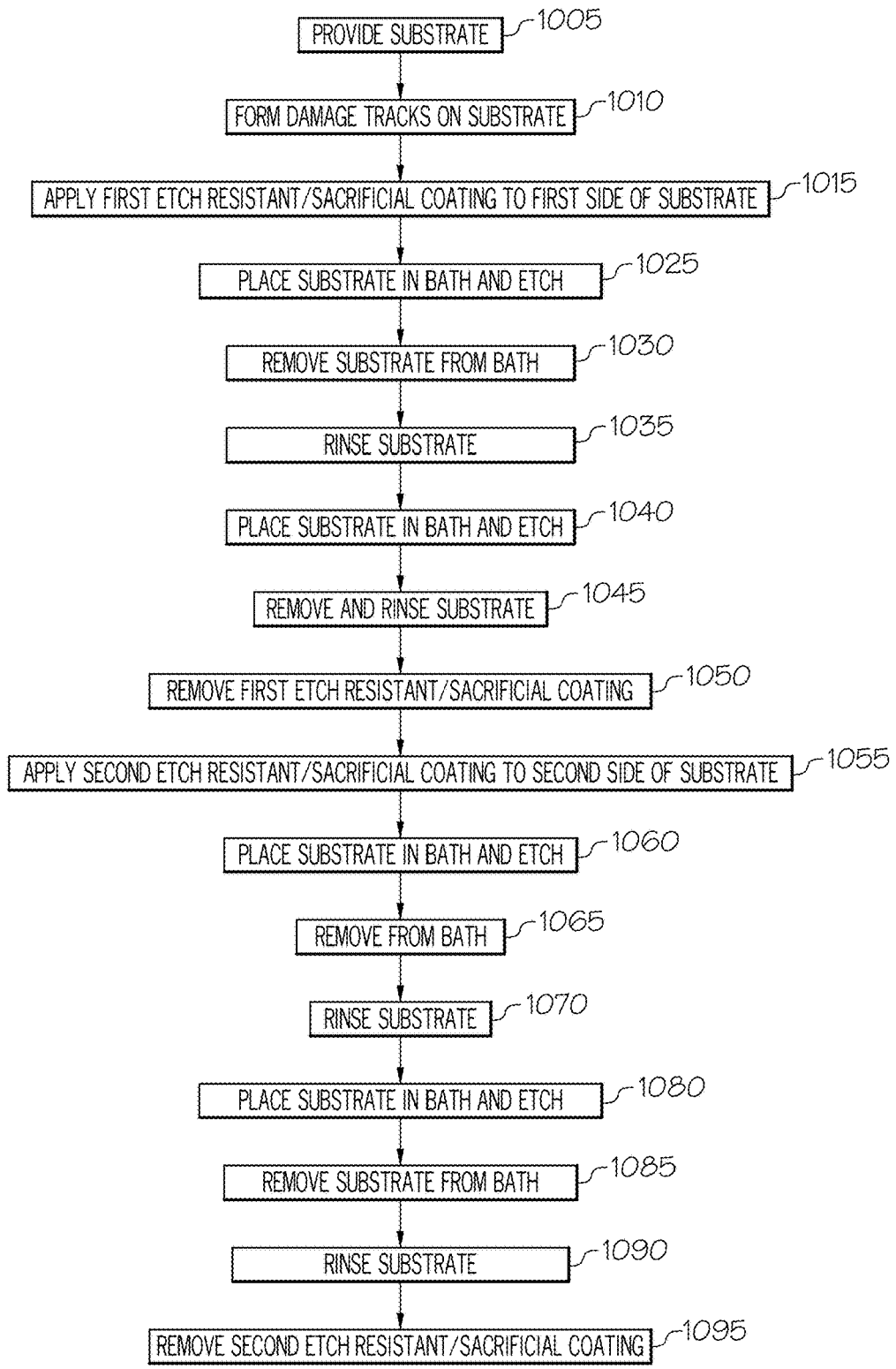
FIG. 10 depicts a flow diagram of yet another illustrative method of forming a glass article according to one or more embodiments shown and described herein.

FIG. 10 depicts an illustrative method of forming a glass-based substrate that includes at least one asymmetrical via (either a blind via, as shown for example in FIG. 3G or a through-glass-via, as shown for example in FIG. 3C or FIG. 3F) having a plurality of tapered regions according to an embodiment. The steps shown in FIG. 10 are merely exemplary and steps may be excluded or additional steps included.

At step 1005, the planar glass-based substrate may be provided. In a particular example, the glass-based substrate may be a 0.75 mm thick 150 mm diameter wafer. At step 1010, one or more damage tracks may be formed on the glass-based substrate, as described in greater detail above with respect to step 510 of FIG. 5A.

At step 1015, a first etch resistant coating (e.g., a sacrificial coating) is applied to a first side (e.g., first surface) of the glass-based substrate. The first etch resistant coating may generally be any coating that is placed on the glass-based substrate to avoid etching when the glass-based substrate is exposed to an etchant, for example an etchant bath, as described herein. In addition, the first etch resistant coating may be any coating that can be temporarily applied. That is, the first etch resistant coating may be a material that is subsequently removable from the glass-based substrate, as described in greater detail herein. The first etch resistant coating may be applied to the first side of the glass-based substrate via any suitable process. Illustrative examples of a process that may be used include chemical vapor deposition (CVD), plasma enhanced chemical vapor deposition (PECVD), ionized deposition, physical vapor deposition (PVD), and a direct application of a material. Illustrative examples of the first etch resistant coating may include, but are not limited to, coatings that contain doped and undoped silicon oxide, silicon carbide, and silicon nitride, polytetrafluoroethylene (PTFE) tape, and/or the like. The first side of the glass-based substrate may be the first major surface of the glass-based substrate or the second major surface of the glass-based substrate. In a particular embodiment, the first side of the glass-based substrate is masked with a PTFE tape and an O-ring is pressed against an edge of the glass-based substrate to seal the edge of the PTFE tape to the surface.

At step 1025, the glass-based substrate is exposed to an etchant, for example an etchant bath (e.g., a first etchant bath) and etched at a particular etch rate (e.g., a first etch rate). In other embodiments, exposure to an etchant may be achieved through any conventional means including, but not limited to, spraying with etchant or applying an etchant cream. The first etchant may be, for example, an acid etchant or a base etchant. The etchant may generally be any solution, including an aqueous solution, water, a mixture of water and other water miscible organic solvents, such as ethylene glycol, propylene glycol, and/or the like. In some embodiments, the etchant may contain a sodium hydroxide solution. In some embodiments, the etchant bath may contain a potassium hydroxide solution. The concentration of the etchant may be, for example, about 4M to about 12M. In a particular embodiment, the first etchant may be a 6M NaOH solution. However, other etchants now known or later developed may also be used without departing from the scope of the present disclosure. The first etch rate is similarly not limited by this disclosure, and may be any etch rate. Illustrative examples of etch rates include, but are not limited to, from about 10 nm/min to about 100 nm/min, including about 10 nm/min, about 20 nm/min, about 30 nm/min, about 40 nm/min, about 50 nm/min, about 60 nm/min, about 70 nm/min, about 80 nm/min, about 90 nm/min, about 100 nm/min, or any value or range between any two of these values (including endpoints). In a particular embodiment, the first etch rate may be about 30 nm/min. In some embodiments, the first etch rate as described above may be greater than the second etch rate (described below). In other embodiments, the first etch rate may be less than the second etch rate. In some embodiments, etching the substrate according to step 1025 may result in a first tapered region for each of the vias.

The first etchant may have one or more other characteristics not specifically described herein. For example, in some embodiments, the etchant bath may be maintained at a particular temperature. One such illustrative temperature is about 85° C.

After a period time has elapsed and/or after a particular amount of the glass-based substrate has been removed, the glass-based substrate may be removed from the etchant (for example, an etchant bath) at step 1030. In some embodiments, the particular amount of time may be, for example, about 10 hours. Other periods of time are contemplated without departing from the scope of the present disclosure, such as, for example, the periods of times described hereinabove with respect to FIG. 7. The particular amount of the glass-based substrate that is removed may vary depending on a desired shape and size of the via. For example, from about 1 micron of material to about 20 microns of material as measured from one of the first major surface and the second major surface may be removed, including about 1 micron, about 5 microns, about 10 microns, about 15 microns, about 20 microns, or any value or range between any two of these values (including endpoints). In a particular embodiment, the amount of material that may be removed may be about 8.5 microns of material as measured from one of the first major surface and the second major surface (i.e., the surface not containing the etch resistant coating).

At step 1035, the glass-based substrate may be rinsed of the etchant material. In some embodiments, the glass-based substrate may be rinsed with a solution containing hydrochloric acid (HCl), such as, for example, a 0.5M HCl solution and/or deionized water, as described in greater detail herein. In some embodiments, the glass-based substrate may be rinsed for a particular period of time to ensure all etchant material has been removed and/or all of the wafer material that was removed from the etchant is separated, such as, for example, about 10 minutes.

At step 1040, the glass-based substrate is exposed to another etchant, for example a bath (e.g., a second etchant bath) and etched at a particular etch rate (e.g., a second etch rate). The second etchant may be, for example, an acid etchant or a base etchant. The second etchant may generally have a concentration that is different from the first etchant. For example, the first etchant as described above may have a greater concentration of an acid etchant or a base etchant than the second etchant. In other embodiments, the first etchant may have a lower concentration of an acid etchant or a base etchant than the second etchant. In some embodiments, the second etchant may be a stagnant bath of about 9.8% (w/w) aqueous hydrofluoric acid solution. However, other etchants now known or later developed may also be used without departing from the scope of the present disclosure. The second etch rate is similarly not limited by this disclosure, and may be any etch rate. For example, the second etch rate may be about 1 micron/min to about 5 micron/min, including about 1 micron/min, about 2 microns/min, about 3 microns/min, about 4 microns/min, about 5 microns/min, or any value or range between any two of these values (including endpoints). In a particular embodiment, the second etch rate may be about 3 microns/min. In some embodiments, etching the substrate according to step 1040 may result in a second tapered region for each of the vias.

After a period time has elapsed and/or after a particular amount of the glass-based substrate has been removed, the glass-based substrate may be removed from the etchant (for example, an etchant bath) and rinsed at step 1045. The period of time is generally not limited by the present disclosure, and may be any period of time. For example, the period of time may be from about 5 minutes to about 40 minutes, including about 5 minutes, about 10 minutes, about 15 minutes, about 20 minutes, about 25 minutes, about 30 minutes, about 35 minutes, about 40 minutes, or any value or range between any two of these values (including endpoints). In some embodiments, the particular amount of time may be about 19 minutes. Other periods of time are contemplated without departing from the scope of the present disclosure. The amount of material removed from the substrate as measured from one of the first major surface and the second major surface (e.g., the surface not containing the first etch resistant coating) is not limited by this disclosure and may be any amount of material. For example, from about 10 microns to about 100 microns of material may be removed, including about 10 microns, about 20 microns, about 30 microns, about 40 microns, about 50 microns, about 60 microns, about 70 microns, about 80 microns, about 90 microns, about 100 microns, or any value or range between any two of these values (including endpoints). In some embodiments, the particular amount of the glass-based substrate that is removed may be about 58 microns of material as measured from one of the first major surface and the second major surface (e.g., the surface not containing the first etch resistant coating). In some embodiments, the glass-based substrate may be rinsed with a solution containing hydrochloric acid (HCl) and/or deionized water, as described in greater detail herein. In some embodiments, the glass-based substrate may be rinsed for a particular period of time to ensure all etchant material has been removed and/or all of the wafer material that was removed from the etchant is separated, such as, for example, about 10 minutes.

At step 1050, the first etch resistant coating may be removed from the glass-based substrate. Removal may be completed by any suitable method for removing a sacrificial coating, and is not limited by this disclosure. At step 1055, a second etch resistant coating (e.g., sacrificial coating) is applied to a second side of the substrate. The second etch resistant coating may any coating, and may be applied by any method, described above with respect to step 1015.

At step 1060, the glass-based substrate is placed in another etchant, for example an etchant bath (e.g., a third etchant bath) and etched at a particular etch rate (e.g., a third etch rate). The third etchant may be, for example, an acid etchant or a base etchant. The third etchant may generally have a concentration that is different from the first etchant and/or the second etchant. For example, the first etchant and/or the second etchant as described above may have a greater concentration of an acid etchant or a base etchant than the third etchant bath. In other embodiments, the first etchant bath and/or the second etchant bath may have a lower concentration of an acid etchant or a base etchant than the third etchant. In some embodiments, the third etchant may be a stagnant bath of about 9.8% (w/w) aqueous hydrofluoric acid solution. However, other etchants s now known or later developed may also be used without departing from the scope of the present disclosure. The third etch rate is similarly not limited by this disclosure, and may be any etch rate. In some embodiments, the third etch rate may be about 1 micron/min to about 5 microns/min, including about 1 micron/min, about 2 microns/min, about 3 microns/min, about 4 microns/min, about 5 microns/min, or any value or range between any two of these values (including endpoints). In a particular embodiment, the third etch rate may be about 3 microns/min. In some embodiments, etching the substrate according to step 1060 may result in a third tapered region for each of the vias.

After a period time has elapsed and/or after a particular amount of the glass-based substrate has been removed, the glass-based substrate may be removed from the etchant (for example, an etchant bath) at step 1065. The period of time is not limited by the present disclosure, and may be any period of time. For example, the period of time may be, but is not limited to, from about 5 minutes to about 30 minutes, including about 5 minutes, about 10 minutes, about 15 minutes, about 20 minutes, about 25 minutes, about 30 minutes, or any value or range between any two of these values (including endpoints). In some embodiments, the particular amount of time may be about 17 minutes. Other periods of time are contemplated without departing from the scope of the present disclosure. The amount of material removed from the substrate as measured from one of the first major surface and the second major surface (e.g., the surface not containing the first etch resistant coating) is not limited by this disclosure and may be any amount of material. For example, from about 10 microns to about 100 microns of material may be removed, including about 10 microns, about 20 microns, about 30 microns, about 40 microns, about 50 microns, about 60 microns, about 70 microns, about 80 microns, about 90 microns, about 100 microns, or any value or range between any two of these values (including endpoints). In some embodiments, the particular amount of the glass-based substrate that is removed may be about 52 microns of material as measured from one of the first major surface and the second major surface (e.g., the surface not containing the second etch resistant coating).

At step 1070, the glass-based substrate may be rinsed. In some embodiments, the glass-based substrate may be rinsed with a solution containing hydrochloric acid (HCl) and/or deionized water, as described in greater detail herein.

At step 1080, the glass-based substrate is exposed to yet another etchant, for example an etchant bath(e.g., a fourth etchant bath) and etched at a particular etch rate (e.g., a fourth etch rate). The fourth etchant may be, for example, an acid etchant or a base etchant. The fourth etchant may generally be any solution, including an aqueous solution, water, a mixture of water and other water miscible organic solvents, such as ethylene glycol, propylene glycol, and/or the like. In some embodiments, the fourth etchant may contain a sodium hydroxide solution. In some embodiments, the fourth etchant may contain a potassium hydroxide solution. The concentration of the fourth etchant may be, for example, about 4M to about 12M. In a particular embodiment, the fourth etchant may be a 6M NaOH solution. However, other etchants now known or later developed may also be used without departing from the scope of the present disclosure. The fourth etch rate is similarly not limited by this disclosure, and may be any etch rate. In some embodiments, the fourth etch rate may be about 10 nm/min to about 100 nm/min, including about 10 nm/min, about 20 nm/min, about 30 nm/min, about 40 nm/min, about 50 nm/min, about 60 nm/min, about 70 nm/min, about 80 nm/min, about 90 nm/min, about 100 nm/min, or any value or range between any two of these values (including endpoints). In a particular embodiment, the fourth etch rate may be about 30 nm/min. In some embodiments, the fourth etch rate as described above may be greater than the first etch rate, the second etch rate, and/or the third etch rate. In other embodiments, the fourth etch rate may be less than the first etch rate, the second etch rate, and/or the third etch rate. In some embodiments, etching the substrate according to step 1080 may result in a fourth tapered region for each of the vias.

The fourth etchant may have one or more other characteristics not specifically described herein. For example, in some embodiments, the etchant bath may be maintained at a particular temperature. One such illustrative temperature is about 85° C.

After a period time has elapsed and/or after a particular amount of the glass-based substrate has been removed, the glass-based substrate may be removed from the etchant (for example, the etchant bath) at step 1085. The period of time is not limited by this disclosure, and may be any period of time. For example, the period of time may be from about 1 hour to about 24 hours, including about 1 hour, about 4 hours, about 6 hours, about 8 hours, about 12 hours, about 16 hours, about 20 hours, about 24 hours, or any value or range between any two of these values (including endpoints). In some embodiments, the particular amount of time may be, for example, about 5 hours. Other periods of time are contemplated without departing from the scope of the present disclosure. The amount of material removed from the substrate as measured from one of the first major surface and the second major surface (e.g., the surface not containing the first etch resistant coating) is not limited by this disclosure and may be any amount of material. For example, from about 1 micron to about 20 microns of material may be removed, including about 1 micron, about 5 microns, about 10 microns, about 15 microns, about 20 microns, or any value or range between any two of these values (including endpoints). In some embodiments, the particular amount of the glass-based substrate that is removed may be about 4.5 microns of material as measured from one of the first major surface and the second major surface (i.e., the surface not containing the etch resistant coating).

At step 1090, the glass-based substrate may be rinsed of the etchant material. In some embodiments, the glass-based substrate may be rinsed with deionized water.

At step 1095, the second etch resistant coating may be removed from the glass-based substrate. Removal may be completed by any suitable method for removing a sacrificial coating, and is not limited by this disclosure. The resulting substrate may include, for example, vias having a diameter of about 150 microns at the first major surface, about 45 microns at the second major surface, a waist diameter of about 20 microns at a location that is about 75 microns from the first major surface, a first tapered region having about a 30:1 taper over a length of about 200 microns from the first major surface to an intersection with a second tapered region, the second tapered region having about a 3:1 taper over a length of about 175 microns from the intersection with the first tapered region to an intersection with a third tapered region, and the third tapered region having about a 30:1 taper over a length of about 125 microns from the intersection with the second tapered region to a midpoint. In addition, a fourth tapered region may extend from the midpoint towards the second major surface and may have about a 3:1 taper for a length of about 100 microns. The total distance from the first major surface to the second major surface may be about 300 microns.

It should be understood that various processes described with respect to FIG. 10 may be repeated for subsequent tapered regions in the vias. For example, various combinations of steps 1005-1015, steps 1025-1035, steps 1040-1045, steps 1050-1070, and/or steps 1080-1095 may be repeated as necessary.

Example 5 depicts an illustrative via formed via the various processes described with respect to FIG. 10:

EXAMPLE 5

A through-glass-via with asymmetric piecewise varying sidewall taper may be formed with the following steps:
    Damage tracks were initially formed in 0.75 mm thick 150 mm diameter glass-based wafers using a 1064 nm picosecond laser. This energy density was above the damage threshold of the glass-based wafer along the entire axis of the laser.

The B-side of the glass-based wafer was masked with a PTFE tape. An O-ring was pressed against the edge of the substrate to seal the edge of the tape to the surface.

The glass-based wafers were then immersed in a bath of 6M sodium hydroxide at 85° C. for 10 hours (removing ~8.5 microns). This process had an etch rate of about 30.

The wafers were then rinsed in 0.5M HCl for 10 minutes and rinsed in DI water for 10 minutes.

The wafers were placed in a stagnant bath of 9.8% (w/w) aqueous hydrofluoric acid solution for 19 minutes (removing ~58 microns). This process had an etch rate of about 3 (e.g., 2.8-3.2).

The wafers were then rinsed in 0.5M HCl for 10 minutes and rinsed in DI water for 10 minutes.

The mask was removed from the B-side. The A-side of the glass-based wafer was masked with a PTFE tape. An O-ring was pressed against the edge of the substrate to seal the edge of the tape to the surface.

The wafers were placed in a stagnant bath of 9.8% (w/w) aqueous hydrofluoric acid solution for 17 minutes (removing ~52 microns). This process had an etch rate of about 3 (e.g., 2.8-3.2).

The wafers are then rinsed in 0.5M HCl for 10 minutes and rinsed in DI water for 10 minutes.

The wafers were then placed in a process carrier with a pitch of 6.4 mm. The process carrier was then immersed in a bath of 6M sodium hydroxide at 85° C. for 5 hours (removing ~4.5 microns). This process had an etch rate of about 30.

The wafers were then removed from alkaline bath and rinsed with copious amounts of DI water.

The mask was removed from the A-side.

Figure 11:
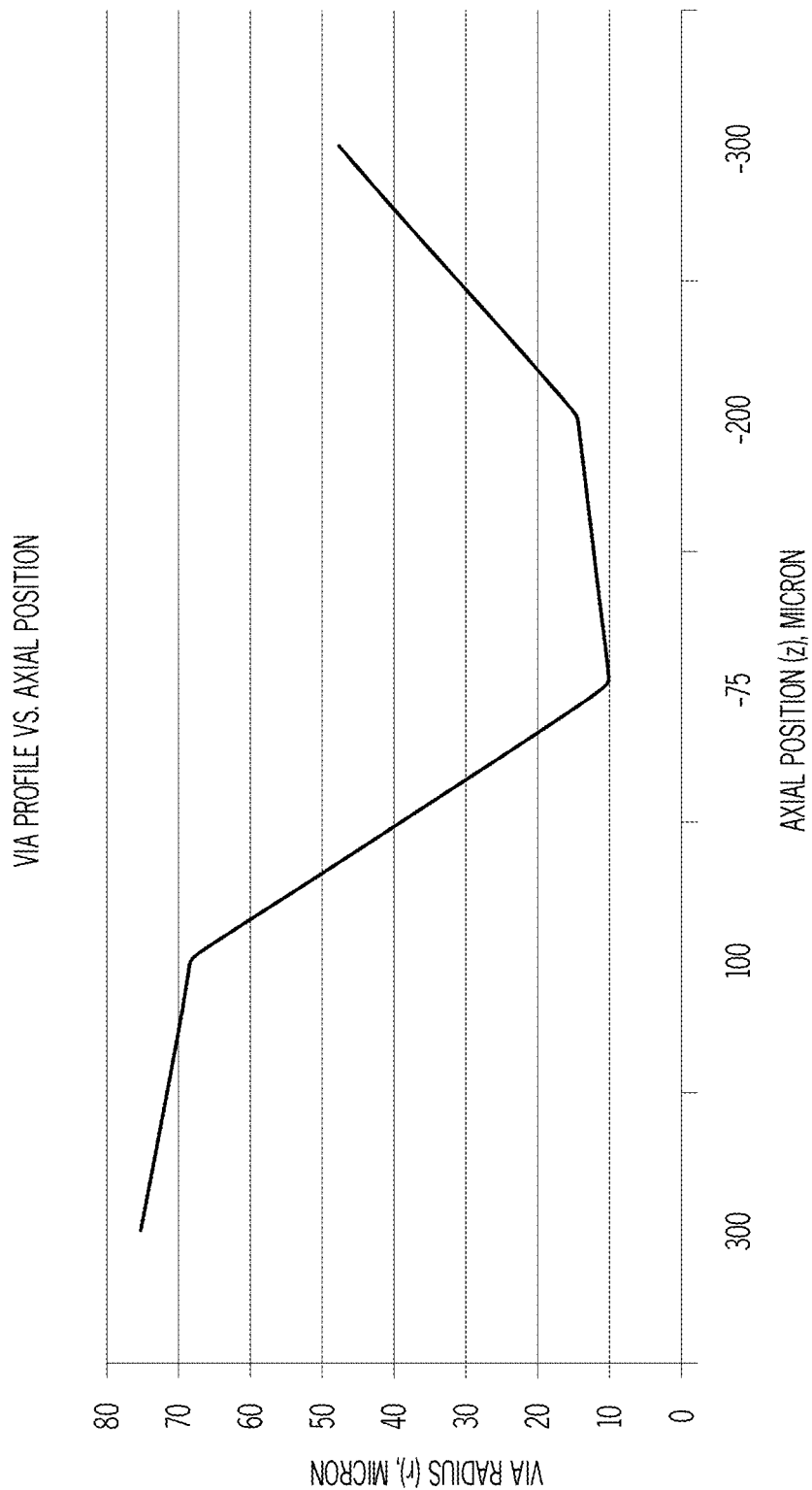
FIG. 11 graphically depicts an illustrative via profile vs. an axial position of one of the glass articles formed from the process described with respect to FIG. 10.

This resulted in a substrate in which the vias have been opened to an entry diameter of 150 microns on the A-side, 45 microns on the B-side, a waist diameter of 20 microns at z=−75 microns, a 30:1 taper for the first 200 microns deep from the surface on the A-side, followed by a 3:1 taper for another 175 microns, followed by a 30:1 taper opening for 125 microns, followed by a 3:1 taper opening for 100 microns on the opposite of the glass. The final glass thickness is 600 microns, as depicted in FIG. 11.

Figure 12:
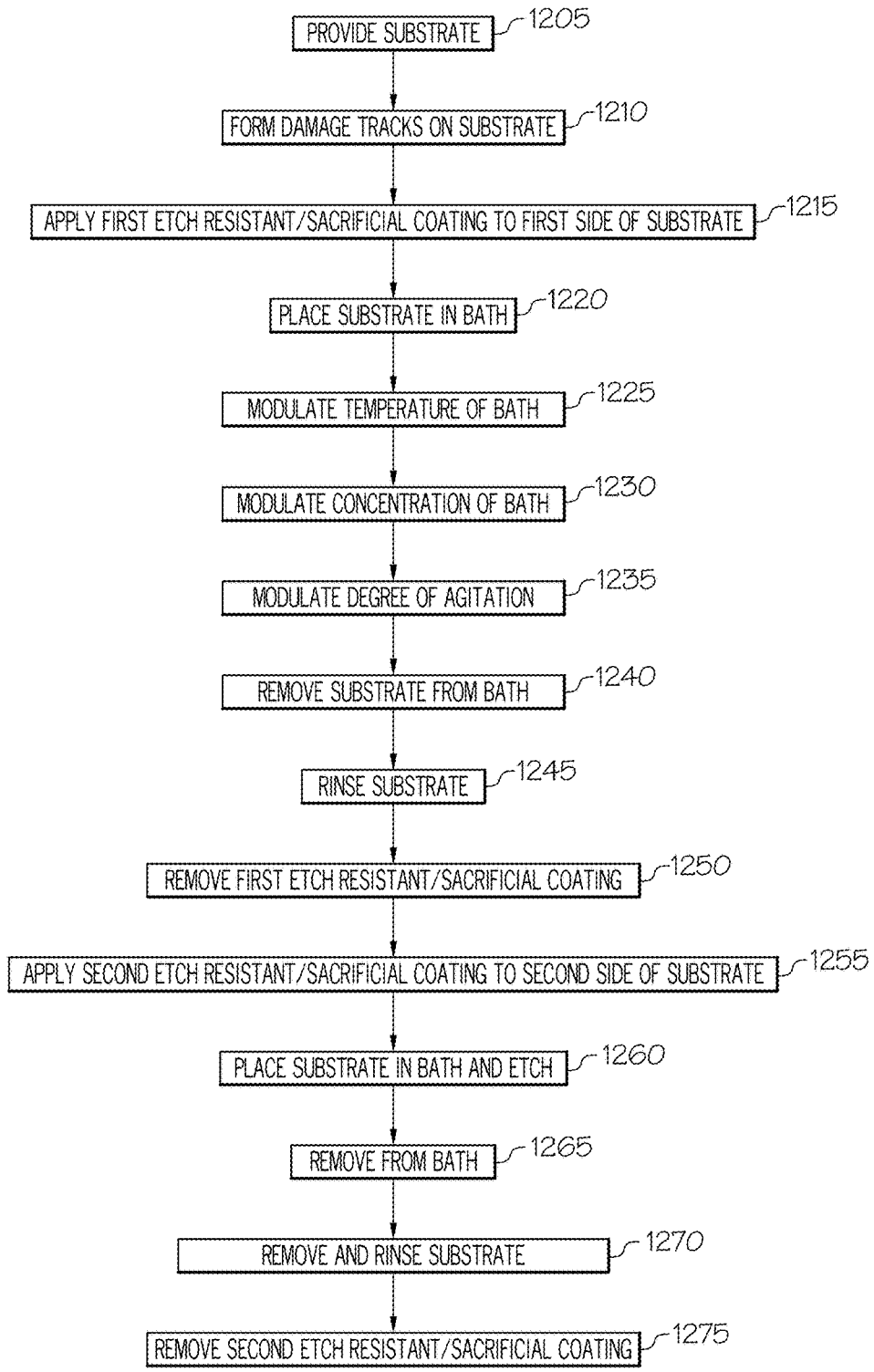
FIG. 12 depicts a flow diagram of yet another illustrative method of forming a glass article according to one or more embodiments shown and described herein.

The method described herein with respect to FIG. 12 may be used to form an asymmetric through-glass-via having a continuously varying taper in the interior wall, as shown for example in FIG. 3E.

Still referring to FIG. 12, at step 1205, the planar glass-based substrate may be provided. As described herein, the glass-based substrate may generally be a glass-based substrate that is suitable for creation of vias therethrough. In a particular example, the glass-based substrate may be a 0.56 mm thick 150 mm diameter wafer.

At step 1210, one or more damage tracks may be formed on the glass-based substrate, as described in greater detail above with respect to step 510 of FIG. 5A. At step 1215, a first etch resistant coating (e.g., a sacrificial coating) is applied to a first side (e.g., first surface) of the glass-based substrate, such as the etch resistant coatings previously described above with respect to step 1015 of FIG. 10.

At step 1220, the glass-based substrate is exposed to an etchant, for example an etchant bath (e.g., a first etchant bath). In other embodiments, exposure to an etchant may be achieved through any conventional means including, but not limited to, spraying with etchant or applying an etchant cream. The first etchant may be, for example, an acid etchant or a base etchant. In a particular embodiment, the first etchant may be a 12M NaOH solution. However, other etchants now known or later developed may also be used without departing from the scope of the present disclosure.

The etchant (for example, an etchant bath) may be initially placed at a particular temperature, and the temperature may be modulated over a period of time at step 1225, as described in greater detail above with respect to step 720 of FIG. 7. The etchant temperature is not limited by this disclosure, and may generally be any temperature, particularly temperatures that are understood to be suitable for the etching processes described herein. For example, the etchant temperature may be from about 95° C. to about 130° C., including about 95° C., about 100° C., about 110° C., about 120° C., about 130° C., or any value or range between any two of these values (including endpoints). The temperature of the etchant may influence the reaction time. In a particular embodiment, the etchant may be initially set to 120° C. and linearly increased to 130° C. over the course of a 16.5 hour period. In some embodiments, a concentration of the acid or base etchant in the bath may be modulated at step 1230, as described in greater detail above with respect to step 725 of FIG. 7. In some embodiments, a degree of agitation exerted on the bath may be modulated at step 1235, as described in greater detail above with respect to step 730 of FIG. 7.

The glass-based substrate may be removed from the bath at step 1240 and at step 1245, the glass-based substrate may be rinsed of the etchant material. In some embodiments, the glass-based substrate may be rinsed with a solution containing hydrochloric acid (HCl) and/or deionized water. In a particular embodiment, the glass-based substrate may be rinsed in the 0.5M HCl solution for 10 minutes and subsequently rinsed with deionized water for 10 minutes.

At step 1250, the first etch resistant coating may be removed from the glass-based substrate. Removal may be completed by any suitable method for removing a sacrificial coating, and is not limited by this disclosure. At step 1255, a second etch resistant coating (e.g., sacrificial coating) is applied to a second side of the substrate, as described in greater detail above with respect to step 1055 of FIG. 10.

At step 1260, the glass-based substrate is exposed to another etchant, for example an etchant bath (e.g., a second etchant bath) and etched at a particular etch rate so as to obtain a via having an asymmetric profile, as described in greater detail herein. The second etchant may be, for example, an acid etchant or a base etchant. The second etchant may generally have a concentration that is different from the first etchant. For example, the first etchant as described above may have a greater concentration of an acid etchant or a base etchant (either initially or finally) than the second etchant. In other embodiments, the first etchant may have a lower concentration of an acid etchant or a base etchant (either initially or finally) than the second etchant. The concentrations of the etchants is not limited by the present disclosure, and may contain any concentration. For example, the concentration may be from about 0.5% (w/w) to about 20% (w/w) aqueous hydrofluoric acid solution, including about 0.5% (w/w), about 1% (w/w), about 5% (w/w), about 10% (w/w), about 15% (w/w), about 20% (w/w), or any value or range between any two of these values (including endpoints). In some embodiments, the second etchant may be a stagnant bath of about 9.8% (w/w) aqueous hydrofluoric acid solution. However, other etchants now known or later developed may also be used without departing from the scope of the present disclosure. The second etch rate is similarly not limited by this disclosure, and may be any etch rate. In some embodiments, the second etch rate may be about 1 micron/min to about 5 microns/ min, including about 1 micron/min, about 2 microns/min, about 3 microns/min, about 4 microns/min, about 5 microns/min, or any value or range between any two of these values (including endpoints). In a particular embodiment, the second etch rate may be about 3 microns/min.

After a period time has elapsed and/or after a particular amount of the glass-based substrate has been removed, the glass-based substrate may be removed from the etchant (for example an etchant bath) at step 1265. The period of time is not limited by this disclosure, and may generally be any period of time. For example, the period of time may be from about 5 minutes to about 60 minutes, including about 5 minutes, about 10 minutes, about 20 minutes, about 30 minutes, about 40 minutes, about 50 minutes, about 60 minutes, or any value or range between any two of these values (including endpoints). In some embodiments, the particular amount of time may be, for example, about 44 minutes. Other periods of time are contemplated without departing from the scope of the present disclosure. The amount of material removed from the substrate as measured from one of the first major surface and the second major surface (e.g., the surface not containing the second etch resistant coating) is not limited by this disclosure and may be any amount of material. For example, from about 10 microns to about 100 microns of material may be removed, including about 10 microns, about 20 microns, about 30 microns, about 40 microns, about 50 microns, about 60 microns, about 70 microns, about 80 microns, about 90 microns, about 100 microns, or any value or range between any two of these values (including endpoints). In some embodiments, the particular amount of the glass-based substrate that is removed may be, for example, about 51 microns of material as measured from one of the first major surface and the second major surface (e.g., the surface not containing the second etch resistant coating).

At step 1270, glass-based substrate is removed and glass-based substrate may be rinsed. In some embodiments, the glass-based substrate may be rinsed with a solution containing deionized water.

At step 1275, the second etch resistant coating may be removed from the glass-based substrate. Removal may be completed by any suitable method for removing a sacrificial coating, and is not limited by this disclosure. The resulting substrate may include, for example, vias having a diameter of about 48 microns at the first major surface, about 109 microns at the second major surface, a waist diameter of about 20 microns, and a continuously varying profile that extends about 357 microns from the first major surface and a 3:1 taper extending 124 microns from the second major surface. The total distance from the first major surface to the second major surface may be about 490 microns.

Example 6 depicts an illustrative via formed via the various processes described with respect to FIG. 12:

EXAMPLE 6

Figure 13:
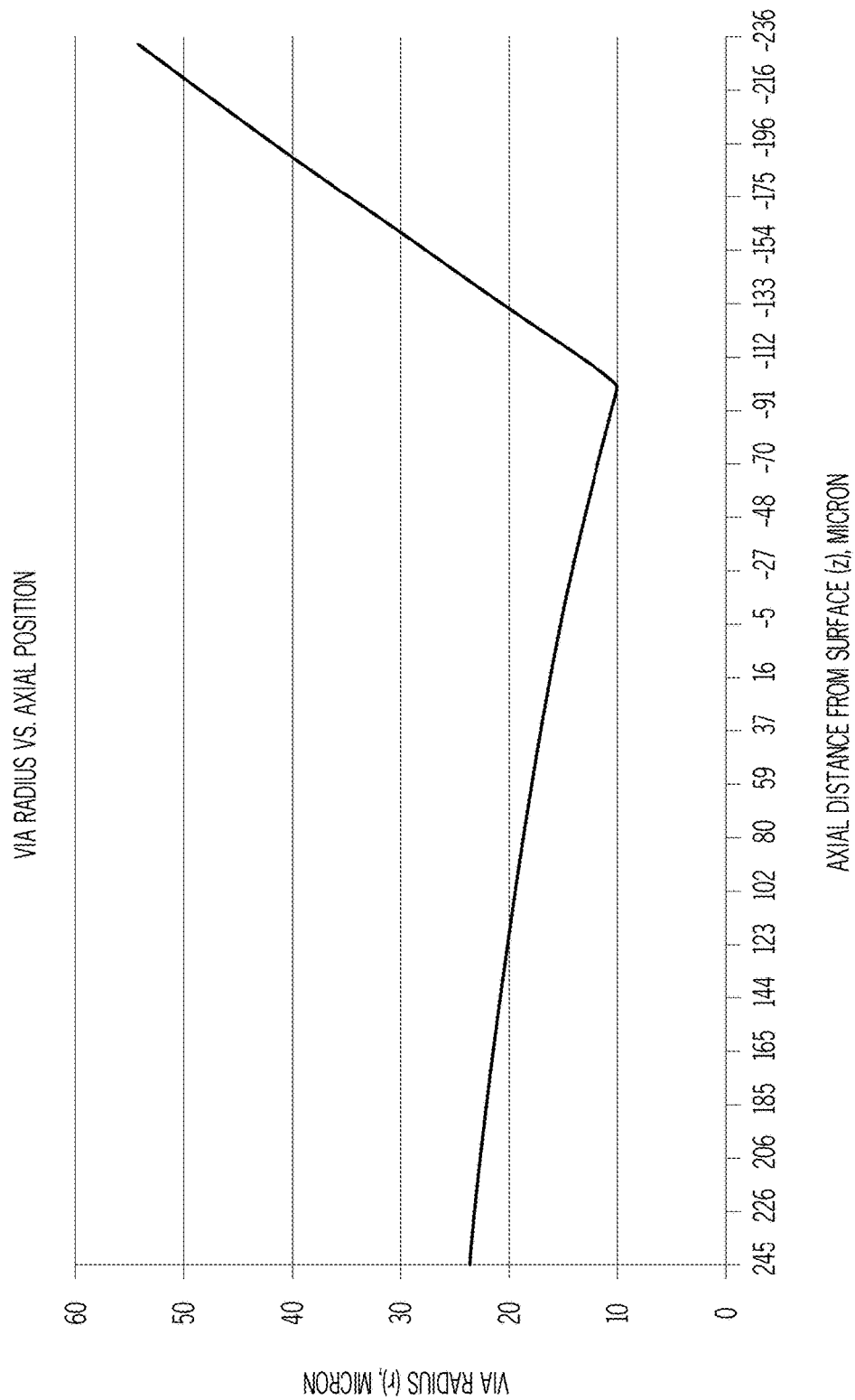
FIG. 13 graphically depicts an illustrative via radius vs. an axial position of one of the glass articles formed from the process described with respect to FIG. 12.

A through-glass-via with asymmetric continuously varying sidewall taper may be formed with the following steps:
 Damage tracks were initially formed in 0.56 mm thick 150 mm diameter glass-based wafers using a 1064 nm picosecond laser. This energy density was above the damage threshold of the glass-based wafer along the entire axis of the laser.
 The A-sides of the glass-based wafers were masked with a PTFE tape. An O-ring was pressed against the edge of the substrate to seal the edge of the tape to the surface.
 The wafers were placed in a stagnant bath of 12M aqueous sodium hydroxide solution. The temperature is initially set to 120° C. but was increased linearly to 130° C. over the course of 16.5 hours.
 The wafers were then rinsed in 0.5M HCl for 10 minutes and rinsed in DI water for 10 minutes.
 The mask was then removed from the A-sides and a similar mask was applied to the B-sides.
 The wafers were placed in a stagnant bath of 9.8% (w/w) aqueous hydrofluoric acid solution for 44 minutes (removing ~51 microns). This process has an etch rate of about 3 (e.g., 2.8-3.2).
 The wafers were then removed from alkaline bath and rinsed with copious amounts of DI water.
 This resulted in a substrate in which the vias have been opened to an entry diameter of 48 microns on the A-side, an entry diameter of 109 microns on the B-side, a waist diameter of 20 microns, a continuously varying profile is shown below extending 357 microns from the A-side and a 3:1 taper is present from the B-side extending 124 microns deep. The substrate is 490 microns thick, as depicted in FIG. 13.

It should now be understood that the embodiments described herein generally relate to glass-based substrates that include one or more vias formed therein that have a symmetrical or asymmetrical cross sections about a plane that is parallel to the two major surfaces of the glass-based substrate and an inner wall with a plurality of tapered regions. The slopes of each of the plurality of tapered regions are continuous and distinct from one another.

Embodiment 1. An article comprising: a glass-based substrate comprising a first major surface, a second major surface spaced a distance from the first major surface, and a tapered through via extending through the substrate from the first major surface to the second major surface, the tapered through via comprising: a cross section that is symmetrical about a plane that is between and equidistant to the first major surface and the second major surface of the glass-based substrate; and an interior wall comprising a first tapered region and a second tapered region positioned between the first major surface and the plane, wherein: a slope of the first tapered region is constant, a slope of the second tapered region is constant, and the slope of the first tapered region is not equal to the slope of the second tapered region.

Embodiment 2. An article comprising: a glass-based substrate comprising a first major surface, a second major surface spaced a distance from first major surface, and a tapered via extending through the substrate from the first major surface towards the second major surface, the tapered via comprising: a cross section that is asymmetrical about a plane that is between and equidistant to the first major surface and the second major surface of the glass-based substrate; and an interior wall comprising a first tapered region and a second tapered region positioned between the first major surface and the plane, wherein: a slope of the first tapered region is constant, a slope of the second tapered region is constant, and the slope of the first tapered region is not equal to the slope of the second tapered region.

Embodiment 3. The article of any preceding embodiment, wherein: the slope of the first tapered region comprises a height to length ratio from 3:1 to 100:1; and the slope of the second tapered region comprises a height to length ratio from 3:1 to 100:1.

Embodiment 4. The article of any preceding embodiment, wherein the first tapered region extends from the first major surface towards the second major surface at a distance of 15 microns to 360 microns.

Embodiment 5. The article of any preceding embodiment, wherein the second tapered region extends from an intersection with the first tapered region towards the second major surface at a distance of 35 microns to 175 microns.

Embodiment 6. The article of embodiments 1-4, wherein the second tapered region extends from the second major surface towards the first major surface at a distance of 35 microns to 175 microns.

Embodiment 7. The article of any preceding embodiment, wherein a diameter of the tapered via at the first major surface is from 10 microns to 250 microns.

Embodiment 8. The article of any preceding embodiment, wherein a diameter of the tapered via at the plane is from 5 microns to 200 microns.

Embodiment 9. The article of any preceding embodiment, further comprising a transition area between the first tapered region and the second tapered region, wherein the transition area comprises an area that transitions from the slope of the first tapered region to the slope of the second tapered region such that a slope of a tangent line from the interior wall changes at least 0.57 degrees.

Embodiment 10. The article of embodiment 9, wherein the transition area is a point or an extended region.

Embodiment 11. The article of any preceding embodiment, wherein the distance between the first major surface and the second major surface is in a range from 25 microns to 3,000 microns.

Embodiment 12. The article of any preceding embodiment, wherein: the interior wall further comprises a third tapered region; and a slope of the third tapered region is different from at least one of the slope of the first tapered region and the slope of the second tapered region.

Embodiment 13. The article of any preceding embodiment, wherein the glass-based substrate is chemically strengthened.

Embodiment 14. The article of any preceding embodiment, wherein the glass-based substrate comprises a laminate.

Embodiment 15. The article of any preceding embodiment, wherein the tapered via is filled with electrically conductive material.

Embodiment 16. The article of any one of embodiments 2-15, wherein the tapered via comprises a through via.

Embodiment 17. The article of any one of embodiments 2-15, wherein the tapered via comprises a blind via.

Embodiment 18. A semiconductor package comprising: a glass-based substrate comprising a first major surface, a second major surface spaced a distance from the first major surface, and a tapered through via extending through the substrate from the first major surface to the second major surface, the tapered via comprising: a cross section that is symmetrical about a plane that is between and equidistant to the first major surface and the second major surface of the glass-based substrate; and an interior wall comprising a first tapered region and a second tapered region positioned between the first major surface and the plane, wherein: a slope of the first tapered region is constant, a slope of the second tapered region is constant, and the slope of the first tapered region is not equal to the slope of the second tapered region, an electrically conductive material disposed within the tapered through via; and a semiconductor device electrically coupled to the electrically conductive material disposed within the tapered through via.

Embodiment 19. A semiconductor package comprising: a glass-based substrate comprising a first major surface, a second major surface spaced a distance from the first major surface, and a tapered via extending through the substrate from the first major surface towards the second major surface, the tapered via comprising: a cross section that is asymmetrical about a plane that is between and equidistant to the first major surface and the second major surface of the glass-based substrate; and an interior wall comprising a first tapered region and a second tapered region positioned between the first major surface and the plane, wherein: a slope of the first tapered region is constant, a slope of the second tapered region is constant, and the slope of the first tapered region is not equal to the slope of the second tapered region, an electrically conductive material disposed within the tapered via; and a semiconductor device electrically coupled to the electrically conductive material disposed within the tapered via.

Embodiment 20. A method of forming a glass-based substrate comprising at least one via, the method comprising: etching a glass-based article having at least one damage track with a first etchant at a first etch rate; and etching the glass-based article with a second etchant, wherein the second etchant comprises a concentration of etchant that is different from a concentration of the first etchant at a second etch rate to form the glass-based substrate comprising the at least one via, wherein the at least one via comprises a first tapered region having a first constant slope and a second tapered region having a second constant slope, the first constant slope and the second constant slope are unequal.

Embodiment 21. The method of embodiment 20, wherein the first etchant comprises a greater concentration of an acid etchant or a base etchant than the second etchant.

Embodiment 22. The method of embodiment 20 or 21, wherein the first etchant comprises a lower concentration of an acid etchant or a base etchant than the second etchant.

Embodiment 23. The method of embodiment 22, wherein the first etchant and the second etchant each comprise an acid etchant or a base etchant.

Embodiment 24. The method of any one of embodiments 20-23, wherein the first etch rate is greater than the second etch rate.

Embodiment 25. The method of any one of embodiments 20-23, wherein the first etch rate is less than the second etch rate.

Embodiment 26. The method of any one of embodiments 20-25, further comprising forming the at least one damage track wherein an energy delivered to the planar glass-based article is above a damage threshold along an entire width of the glass-based article.

Embodiment 27. The method of embodiment 26, wherein forming the at least one damage track comprises forming a damage track such that the energy delivered to the glass-based article is above the damage threshold along a first side of the glass-based article and below the damage threshold along a second side of the glass-based article.

Embodiment 28. The method of any one of embodiments 20-27, further comprising: applying a first etch resistant coating to a first side of the glass-based article prior to etching the glass-based article with first etchant; removing the first etch resistant coating from the first side of the glass-based article after etching the glass-based article with the second etchant; applying a second etch resistant coating to a second side of the glass-based article; etching the glass-based article with the second etch resistant coating applied to the second side of the glass-based article with a third etchant bath; and removing the second etch resistant coating from the second side of the planar glass-based article.

Embodiment 29. The method of any one of embodiments 20-28, further comprising: etching the planar glass-based article in a third etchant to form the glass-based substrate comprising the at least one via.

Embodiment 30. The method of any one of embodiments 20-29, further comprising modulating at least one of a temperature, the concentration of etchant, and a degree of agitation of at least one of the first etchant and the second etchant.

Embodiment 31. The method of any one of embodiments 20-30, wherein each one of the at least one via comprises a through via or a blind via.

Embodiment 32. The method of any one of embodiments 20-31, wherein the at least one via comprises a cross section that is symmetrical about a plane that is between and equidistant to a first major surface and a second major surface of the glass-based substrate.

Embodiment 33. The method of any one of embodiments 20-32, wherein the at least one via comprises a cross section that is asymmetrical about a plane that is between and equidistant to a first major surface and a second major surface of the glass-based substrate.

Embodiment 34. A method of forming a glass-based substrate comprising at least one through via, the method comprising: etching a glass-based article having at least one damage track in an etchant; and modulating at least one of a temperature, a concentration, and a degree of agitation of the etchant to form the glass-based substrate comprising the at least one through via such that the at least one through via comprises a continuously varying sidewall taper and a cross section that is symmetrical about a plane that is between and equidistant to a first major surface and a second major surface of the glass-based substrate.

Embodiment 35. A method of forming a glass-based substrate comprising at least one blind via, the method comprising: etching a glass-based article having at least one damage track in an etchant; and modulating at least one of a temperature, a concentration, and a degree of agitation of the etchant to form the glass-based substrate comprising the at least one blind via such that the at least one blind via comprises a continuously varying sidewall taper.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. An article comprising:
   a glass-based substrate comprising a first major surface, a second major surface spaced a distance from and parallel to the first major surface, and a tapered via extending through the substrate from the first major surface towards the second major surface, the tapered via comprising:
      a cross section that is symmetrical about a plane that is between and equidistant to the first major surface and the second major surface of the glass-based substrate; and
      an interior wall comprising a first tapered region and a second tapered region positioned between the first major surface and the plane, wherein:
         a slope of the first tapered region is constant and comprises a height to length ratio from 3:1 to 100:1,
         a slope of the second tapered region is constant and comprises a height to length ratio from 3:1 to 100:1, and
         the slope of the first tapered region is not equal to the slope of the second tapered region.

2. The article of claim 1, wherein the tapered via comprises a through via.

3. The article of claim 1, wherein a diameter of the tapered via at the first major surface is from 10 microns to 250 microns.

4. The article of claim 1, wherein a diameter of the tapered via at the first major surface and at the second major surface is from 10 microns to 250 microns.

5. The article of claim 1, wherein a diameter of the tapered via at the plane is from 5 microns to 200 microns.

6. The article of claim 1, further comprising a transition area between the first tapered region and the second tapered region, wherein the transition area comprises an area that transitions from the slope of the first tapered region to the slope of the second tapered region such that a slope of a tangent line from the interior wall changes at least 5 degrees.

7. The article of claim 1, wherein:
   the interior wall further comprises a third tapered region; and
   a slope of the third tapered region is different from at least one of the slope of the first tapered region and the slope of the second tapered region.

8. A semiconductor package comprising:
   a glass-based substrate comprising a first major surface, a second major surface spaced a distance from and parallel to the first major surface, and a tapered via extending through the substrate from the first major surface towards the second major surface, the tapered via comprising:
      a cross section that is:
         symmetrical about a plane that is between and equidistant to the first major surface and the second major surface of the glass-based substrate, or
         asymmetrical about the plane; and
      an interior wall comprising a first tapered region and a second tapered region positioned between the first major surface and the plane, wherein:
         a slope of the first tapered region is constant,
         a slope of the second tapered region is constant, and
         the slope of the first tapered region is not equal to the slope of the second tapered region,
   an electrically conductive material disposed within the tapered via; and
   a semiconductor device electrically coupled to the electrically conductive material disposed within the tapered via.

9. The semiconductor package of claim 8, wherein:
   the slope of the first tapered region comprises a height to length ratio from 3:1 to 100:1; and
   wherein the slope of the second tapered region comprises a height to length ratio from 3:1 to 100:1.

10. The semiconductor package of claim 8, further comprising a transition area between the first tapered region and the second tapered region, wherein the transition area comprises an area that transitions from the slope of the first tapered region to the slope of the second tapered region such that a slope of a tangent line from the interior wall changes at least 5 degrees.

11. The semiconductor package of claim 10, wherein the transition area is a point or an extended region.

12. An article comprising:
a glass-based substrate comprising a first major surface, a second major surface spaced a distance from and parallel to the first major surface, and a tapered via extending through the substrate from the first major surface towards the second major surface, the tapered via comprising:
a cross section that is symmetrical about a plane that is between and equidistant to the first major surface and the second major surface of the glass-based substrate; and
an interior wall comprising a first tapered region and a second tapered region positioned between the first major surface and the plane, wherein:
a slope of the first tapered region is constant,
a slope of the second tapered region is constant,
the slope of the first tapered region is not equal to the slope of the second tapered region, and
a diameter of the tapered via at the first major surface is from 10 microns to 250 microns.

13. The article of claim 12, wherein a diameter of the tapered via at the second major surface is from 10 microns to 250 microns.

14. The article of claim 12, wherein a diameter of the tapered via at the plane is from 5 microns to 200 microns.

15. The article of claim 12, wherein:
the interior wall further comprises a third tapered region; and
a slope of the third tapered region is different from at least one of the slope of the first tapered region and the slope of the second tapered region.

16. An article comprising:
a glass-based substrate comprising a first major surface, a second major surface spaced a distance from and parallel to the first major surface, and a tapered via extending through the substrate from the first major surface towards the second major surface, the tapered via comprising:
a cross section that is symmetrical about a plane that is between and equidistant to the first major surface and the second major surface of the glass-based substrate; and
an interior wall comprising a first tapered region and a second tapered region positioned between the first major surface and the plane, wherein:
a slope of the first tapered region is constant,
a slope of the second tapered region is constant,
the slope of the first tapered region is not equal to the slope of the second tapered region, and
a diameter of the tapered via at the plane is from 5 microns to 200 microns.

17. The article of claim 16, wherein a diameter of the tapered via at the first major surface is from 10 microns to 250 microns.

18. The article of claim 16, wherein:
the interior wall further comprises a third tapered region; and
a slope of the third tapered region is different from at least one of the slope of the first tapered region and the slope of the second tapered region.

19. An article comprising:
a glass-based substrate comprising a first major surface, a second major surface spaced a distance from and parallel to the first major surface, and a tapered via extending through the substrate from the first major surface towards the second major surface, the tapered via comprising:
a cross section that is symmetrical about a plane that is between and equidistant to the first major surface and the second major surface of the glass-based substrate; and
an interior wall comprising a first tapered region, a second tapered region, and a third tapered region positioned between the first major surface and the plane, wherein:
a slope of the first tapered region is constant,
a slope of the second tapered region is constant,
the slope of the first tapered region is not equal to the slope of the second tapered region, and
a slope of the third tapered region is different from at least one of the slope of the first tapered region and the slope of the second tapered region.

20. The article of claim 19, wherein a diameter of the tapered via at the first major surface is from 10 microns to 250 microns.

* * * * *

UNITED STATES PATENT AND TRADEMARK OFFICE
CERTIFICATE OF CORRECTION

PATENT NO. : 10,580,725 B2
APPLICATION NO. : 15/977195
DATED : March 3, 2020
INVENTOR(S) : Tian Huang et al.

Page 1 of 1

It is certified that error appears in the above-identified patent and that said Letters Patent is hereby corrected as shown below:

On the Title Page

Column 2, item (56), U.S. patent documents, Line 1, delete "108,387" and insert -- 208387 --, therefor.

On page 3, Column 2, item (56), other publications, Line 15, delete "Microelectronis" and insert -- Microelectronics --, therefor.

Signed and Sealed this
Thirty-first Day of December, 2024

Derrick Brent
*Acting Director of the United States Patent and Trademark Office*